United States Patent
Kim et al.

(10) Patent No.: US 11,825,724 B2
(45) Date of Patent: Nov. 21, 2023

(54) DISPLAY PANEL AND ELECTRONIC DEVICE INCLUDING THE SAME

(71) Applicant: Samsung Display Co., LTD., Yongin-si (KR)

(72) Inventors: Yong Seok Kim, Seoul (KR); Youngchan Kim, Incheon (KR); Jeongwoo Park, Yongin-si (KR); Minhee Son, Hwaseong-si (KR); Saet Byeol Shin, Cheonan-si (KR); Byeong-Hee Won, Incheon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/981,816

(22) Filed: Nov. 7, 2022

(65) Prior Publication Data

US 2023/0172028 A1 Jun. 1, 2023

(30) Foreign Application Priority Data

Nov. 30, 2021 (KR) .......................... 10-2021-0169041

(51) Int. Cl.
*G09G 3/3208* (2016.01)
*H10K 59/50* (2023.01)
*H10K 50/844* (2023.01)
*H10K 59/122* (2023.01)
*H10K 59/173* (2023.01)

(52) U.S. Cl.
CPC ............ *H10K 59/50* (2023.02); *G09G 3/3208* (2013.01); *H10K 50/844* (2023.02); *G09G 2300/0426* (2013.01); *G09G 2320/028* (2013.01); *H10K 59/122* (2023.02); *H10K 59/173* (2023.02)

(58) Field of Classification Search
CPC .. H01L 33/502; H01L 33/504; H01L 27/3232; G09G 2320/028; H10K 59/122; H10K 50/844
See application file for complete search history.

(56) References Cited

U.S. PATENT DOCUMENTS

| | | | |
|---|---|---|---|
| 2017/0373036 A1* | 12/2017 | Yamazaki | ............. H10K 59/90 |
| 2018/0012943 A1* | 1/2018 | Ikeda | ................... H10K 59/353 |
| 2018/0371189 A1* | 12/2018 | Jang | ........................... C08J 5/18 |
| 2020/0243002 A1* | 7/2020 | He | ........................... G09G 3/32 |

(Continued)

FOREIGN PATENT DOCUMENTS

| | | |
|---|---|---|
| JP | 2020134561 A | 8/2020 |
| KR | 1020160117696 A | 10/2016 |
| KR | 1020180129345 A | 12/2018 |

*Primary Examiner* — Yuzhen Shen
(74) *Attorney, Agent, or Firm* — CANTOR COLBURN LLP

(57) ABSTRACT

The display panel includes a display area including a pixel area, and a light blocking area which is adjacent to the pixel area, a first light emitting device which is in the pixel area of the display area and emits a light having a first wavelength range, a second light emitting device which is in the light blocking area of the display area and emits a light having a second wavelength range different from the first wavelength range, and a discoloration layer which is on the second light emitting device and is color-changeable by the light having the second wavelength range, the discoloration layer defining a first opening exposing the pixel area to outside the discoloration layer.

28 Claims, 24 Drawing Sheets

(56) References Cited

U.S. PATENT DOCUMENTS

| | | | |
|---|---|---|---|
| 2020/0280023 A1* | 9/2020 | Ha | H10K 50/858 |
| 2020/0341522 A1* | 10/2020 | Kim | G06F 1/1652 |
| 2021/0050548 A1* | 2/2021 | Zeng | H10K 50/856 |
| 2021/0111302 A1* | 4/2021 | Pan | H01L 33/50 |
| 2021/0296543 A1* | 9/2021 | Aoyama | G02B 5/20 |
| 2021/0376272 A1* | 12/2021 | You | H10K 59/351 |
| 2022/0020900 A1* | 1/2022 | Kuo | H01L 33/22 |

* cited by examiner

DISPLAY PANEL AND ELECTRONIC DEVICE INCLUDING THE SAME

This application claims priority to Korean Patent Application No. 10-2021-0169041 filed on Nov. 30, 2021, and all the benefits accruing therefrom under 35 U.S.C. § 119, the entire disclosure of which is incorporated herein by reference.

BACKGROUND

1. Field

The present disclosure relates to a display panel and an electronic device including the same. More specifically, the present disclosure relates to a display panel capable of adjusting a viewing angle and an electronic device including the same.

2. Description of the Related Art

A flat panel display device is used as a display device that substitutes for a cathode ray tube display device, due to characteristics such as light weight and thinness of the flat panel display device. Representative examples of such flat panel display devices include a liquid crystal display device and an organic light emitting display device.

The display device includes a display panel and a panel driving unit. In general, the display panel is manufactured to have a wide viewing angle.

SUMMARY

A display panel having a wide viewing angle may allow contents on a display screen to be broadly visible from outside the display panel. To restrict the contents of the display screen from being broadly visible by the wide viewing angle, a display panel having both the wide viewing angle and a narrow viewing angle is being developed.

An object of the present disclosure is to provide a display panel capable of adjusting a viewing angle.

Another object of the present disclosure is to provide an electronic device including the display panel.

However, the present disclosure is not limited by the above-mentioned object, and may be variously expanded without departing from the spirit and scope of the present disclosure.

In order to accomplish the above objects of the disclosure, a display panel according to embodiments of the present disclosure includes a substrate including a display area having a pixel area and a light blocking area, and a non-display area positioned around the display area, a first light emitting device in the pixel area, on the substrate, and configured to emit a light having a first wavelength range, a second light emitting device in the light blocking area, on the substrate, and configured to emit a light having a second wavelength range different from the first wavelength range, and a discoloration layer on the second light emitting device, having a first opening configured to expose at least a portion of the pixel area, and including a photochromic material that is discolored by the light having the second wavelength range.

According to an embodiment, the discoloration layer may have a shape corresponding to a shape of the light blocking area in a plan view.

According to an embodiment, the display panel may further include a first encapsulation layer configured to cover the first light emitting device. The second light emitting device may be on the first encapsulation layer.

According to an embodiment, the first light emitting device may be an active matrix type, and the second light emitting device may be a passive matrix type.

According to an embodiment, the first light emitting device may include a first pixel electrode, a first light emitting layer, and a first common electrode. The second light emitting device may include a second pixel electrode, a second light emitting layer, and a second common electrode. The second light emitting layer may have a shape corresponding to a shape of the light blocking area in a plan view.

According to an embodiment, the second pixel electrode may have a shape corresponding to a shape of the light blocking area in a plan view.

According to an embodiment, the second common electrode may entirely overlap the pixel area and the light blocking area in a plan view.

According to an embodiment, the second common electrode may have a shape corresponding to a shape of the light blocking area in a plan view.

According to an embodiment, the display panel may further include a first pixel defining layer under the first encapsulation layer and configured to expose a portion of the first pixel electrode, and a second pixel defining layer on the first encapsulation layer and configured to expose a portion of the second pixel electrode.

According to an embodiment, the second pixel defining layer may have light-transmitting properties and may overlap the pixel area.

According to an embodiment, the second pixel defining layer may be configured to expose at least a portion of the pixel area.

According to an embodiment, the first encapsulation layer may have a structure including at least one inorganic encapsulation layer and at least one organic encapsulation layer.

According to an embodiment, the first encapsulation layer may have a structure including at least one first inorganic encapsulation layer and at least one second inorganic encapsulation layer having a refractive index different from a refractive index of the first inorganic encapsulation layer.

According to an embodiment, the display panel may further include a first light blocking layer between the first encapsulation layer and the second light emitting device and having a second opening configured to expose the pixel area.

According to an embodiment, a width of the first opening may be equal to a width of the second opening.

According to an embodiment, a width of the first opening may be smaller than a width of the second opening.

According to an embodiment, the display panel may further include a second encapsulation layer configured to cover the second light emitting device. The discoloration layer may be on the second encapsulation layer.

According to an embodiment, the second light emitting device may be on the same layer as the first light emitting device.

According to an embodiment, the first light emitting device may be an active matrix type, and the second light emitting device may be a passive matrix type.

According to an embodiment, each of the first light emitting device and the second light emitting device may be an active matrix type.

According to an embodiment, the first light emitting device may include a first pixel electrode, a first light emitting layer, and a first common electrode. The second light emitting device may include a second pixel electrode, a second light emitting layer, and a second common electrode. The first light emitting layer may overlap the pixel area, and the second light emitting layer may overlap the light blocking area while being spaced apart from the first light emitting layer.

According to an embodiment, the display panel may further include a first encapsulation layer configured to cover the first light emitting device and the second light emitting device, a first light blocking layer on the first encapsulation layer and configured to expose each of the first light emitting layer and the second light emitting layer, and a planarization layer configured to cover the first light blocking layer. The discoloration layer may be on the planarization layer, overlap the second light emitting layer, and expose the first light emitting layer.

According to an embodiment, the display panel may further include a second light blocking layer on the discoloration layer and configured to transmit the light having the first wavelength range and to block the light having the second wavelength range.

In order to accomplish the above objects of the disclosure, a display panel according to embodiments of the present disclosure includes a substrate including a display area having a pixel area and a light blocking area, and a non-display area positioned around the display area, a first light emitting device including a first pixel electrode on the substrate, a first common electrode on the first pixel electrode, and a first light emitting layer between the first pixel electrode and the first common electrode, configured to overlap the pixel area, and configured to emit a light having a first wavelength range, a second light emitting device including a second pixel electrode on the substrate, a second common electrode on the second pixel electrode, and a second light emitting layer between the second pixel electrode and the second common electrode, configured to overlap the light blocking area, and configured to emit a light having a second wavelength range, and a discoloration layer on the second light emitting device, having an opening configured to expose at least a portion of the pixel area, and including a photochromic material that is discolored by the light having the second wavelength range.

In order to accomplish the other objects of the disclosure, an electronic device according to embodiments of the present disclosure includes a display panel configured to display an image, a circuit board connected to the display panel and configured to control an operation of the display panel, a window on the display panel to cover a front surface of the display panel, and a housing that provides a space for accommodating the display panel. The display panel may include a substrate including a display area having a pixel area and a light blocking area, and a non-display area positioned around the display area, a first light emitting device in the pixel area, on the substrate, and configured to emit a light having a first wavelength range, a second light emitting device in the light blocking area, on the substrate, and configured to emit a light having a second wavelength range different from the first wavelength range, and a discoloration layer on the second light emitting device, having a first opening configured to expose at least a portion of the pixel area, and including a photochromic material that is discolored by the light having the second wavelength range.

According to an embodiment, the circuit board may include a first driving unit configured to control an operation of the first light emitting device, and a second driving unit configured to control an operation of the second light emitting device.

According to an embodiment, the window may be configured to transmit the light having the first wavelength range and to block the light having the second wavelength range.

The display panel according to embodiments of the present disclosure may include the first light emitting device and the second light emitting device. The first light emitting device can emit the first light (for example, visible light) for displaying an image. The second light emitting device can emit the second light (for example, ultraviolet light) for switching a mode between a wide viewing angle mode and a narrow viewing angle mode. Accordingly, the viewing angle of the display panel can be adjusted without attaching a separate optical film. In addition, when the display panel is in the narrow viewing angle mode, only a portion of the first light emitted from each pixel with a viewing angle greater than or equal to a predetermined angle can be blocked, and other portions of the first light having a viewing angle less than a predetermined angle can be emitted to the outside of the display panel. Accordingly, the resolution of the display panel cannot be deteriorated even in the narrow viewing angle mode.

In addition, the first light emitting device and the second light emitting device can be in the display area of the display panel. Accordingly, an additional configuration (for example, a light guide plate, a low refractive index layer, a scattering pattern, or the like) required to transmit the second light to the display area may not be required.

However, the effect of the present disclosure is not limited to the above-described effect, and may be variously extended without departing from the spirit and scope of the present disclosure.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
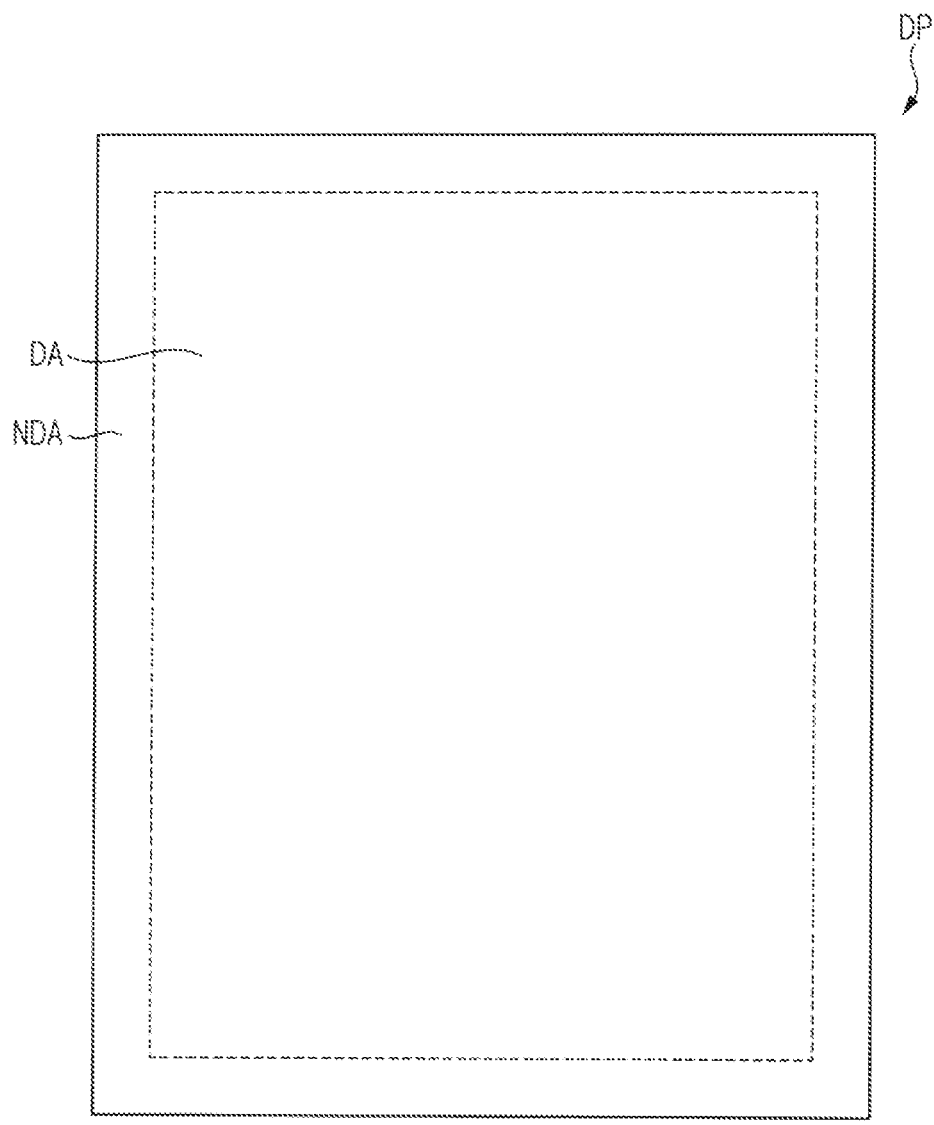
FIG. 1 is a plan view illustrating a display panel according to an embodiment of the present disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Hereinafter, embodiments of the present disclosure will be described in more detail with reference to the accompanying drawings. The same or similar reference numerals will be used for the same components in the accompanying drawings. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
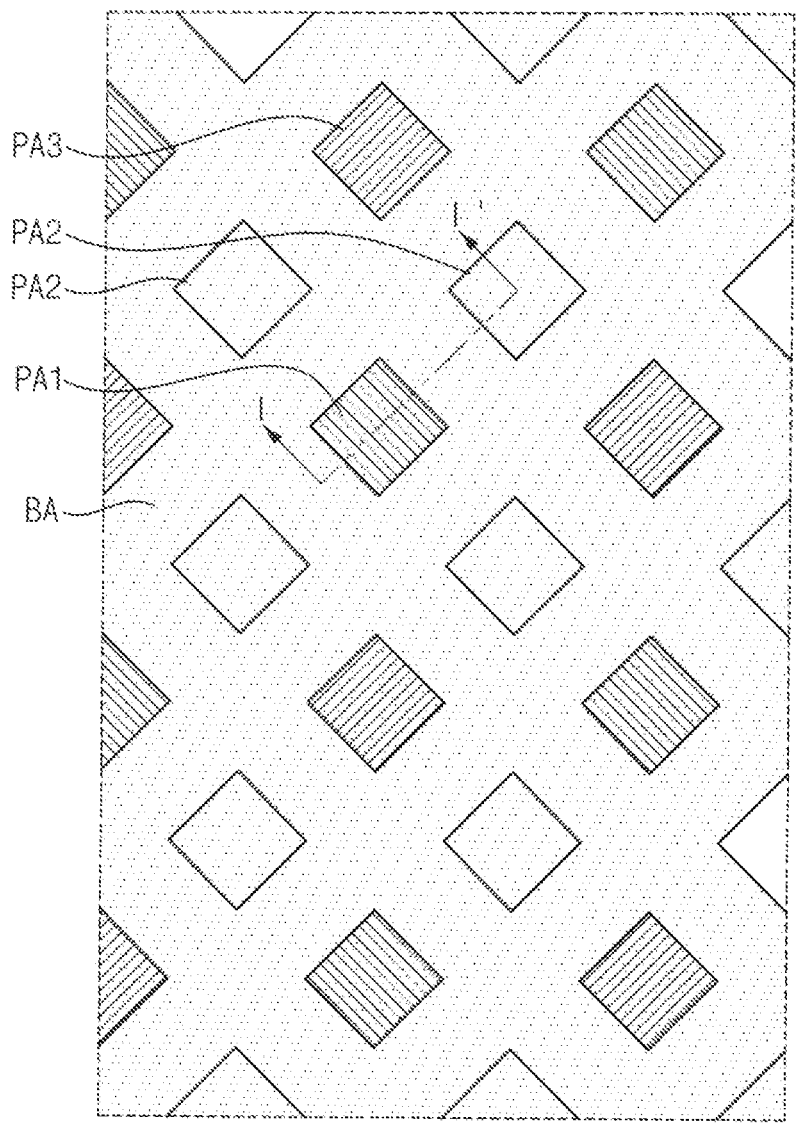
FIG. 2 is an enlarged plan view illustrating a display area of the display panel shown in FIG. 1.

FIG. 1 is a plan view illustrating a display panel DP according to an embodiment of the present disclosure. FIG. 2 is an enlarged plan view illustrating a display area DA of the display panel DP shown in FIG. 1.

Referring to FIGS. 1 and 2, according to an embodiment, a display panel DP (or a substrate SUB included in the display panel DP) may include a display area DA and a non-display area NDA. An image may be displayed in the display area DA. The non-display area NDA may be located adjacent to or around the display area DA. For example, the non-display area NDA may surround the display area DA in a plan view. The display panel DP and various components or layers thereof may be disposed in a plane defined by a first direction and a second direction crossing each other. A third direction which crosses the plane (and the first and second directions) may define a thickness direction of the display panel DP and various components or layers thereof. A plan view may be in (or along) the third direction, or otherwise in (or along) a direction crossing a plane. Various components or layers of the display panel DP may include the display area DA and the non-display area NDA described herein.

The display area DA may include a plurality of pixel areas and a light blocking area BA. The light blocking areas BA may surround each of the pixel areas in a plan view.

As a light emitting element, a first light emitting device LED1 (of FIG. 3) may be disposed in each of the pixel areas. The first light emitting devices LED1 may emit a light having a first wavelength range (hereinafter, referred to as a first light L1). In an embodiment, the first light L1 may be a visible light, and any one of a red light, a green light, and a blue light may be emitted from each of the pixel areas. For example, the first wavelength range may include a wavelength range of the red light (for example, about 640 nanometers (nm) to about 780 nm), a wavelength range of the green light (for example, about 490 nm to about 570 nm), and a wavelength range of the blue light (for example, about 450 nm to about 480 nm).

In an embodiment, the display area DA may include first to third pixel areas PA1, PA2, and PA3 that emit lights of different colors. That is, the first light emitting devices LED1 that emit lights of different colors may be disposed in the first to third pixel areas PA1, PA2, and PA3, respectively. For example, the first light emitting device LED1 that emits a red light may be disposed in the first pixel area PA1, the first light emitting device LED1 that emits a green light may be disposed in the second pixel area PA2, and the first light emitting device LED1 that emits a blue light may be disposed in the third pixel area PA3. The image may be generated by combining the red light, green light, and blue light respectively emitted from the first to third pixel areas PA1, PA2, and PA3.

The first to third pixel areas PA1, PA2, and PA3 may be repeatedly arranged in the display area DA. Although FIG. 2 illustrates that the first to third pixel areas PA1, PA2, and PA3 are arranged in a PENTILE™ type, the present disclosure is not limited thereto. For example, the first to third pixel areas PA1, PA2, and PA3 may be arranged in a stripe type.

The light blocking area BA may surround each of the first to third pixel areas PA1, PA2, and PA3 in a plan view. For example, as shown in FIG. 2, the light blocking area BA may have a grid shape in a plan view.

In an embodiment, a light blocking layer (for example, the first light blocking layer BL1 of FIG. 3) may be disposed in the light blocking area BA. For example, the light blocking layer may include a black matrix. The light blocking layer may prevent the red light, green light, and blue light emitted from the first to third pixel areas PA1, PA2, and PA3 from being mixed with each other.

As a light emitting element, a second light emitting device (for example, a second light emitting device LED2 of FIG. 3) may be disposed in the light blocking area BA. For example, the second light emitting device LED2 may be disposed on the black matrix layer (for example, a first light blocking layer BL1 of FIG. 3). The second light emitting device LED2 may emit a light having a second wavelength range (hereinafter, referred to as a second light L2) different from the first wavelength range. For example, the second wavelength range may be less than about 450 nm or greater than about 780 nm. For example, the second light L2 may be ultraviolet or infrared ray, but the present disclosure is not limited thereto.

The display panel DP may be driven in a first mode or a second mode according to a preset condition. The first mode of the display panel DP may be a mode for implementing a wide viewing angle, and the second mode of the display panel DP may be a mode for implementing a narrow viewing angle relative to the wide viewing angle. In the first mode and the second mode of the display panel DP, a viewing angle of the display panel DP may be adjusted according to whether the second light emitting device LED2 emits light. That is, the display panel DP has a viewing angle which is adjustable, the display panel DP has a first mode in which the viewing angle is wide and the display panel DP has a second mode in which the viewing angle is narrower than the viewing angle in the first mode. This will be described below in detail with reference to FIGS. 6A and 6B.

Figure 3:
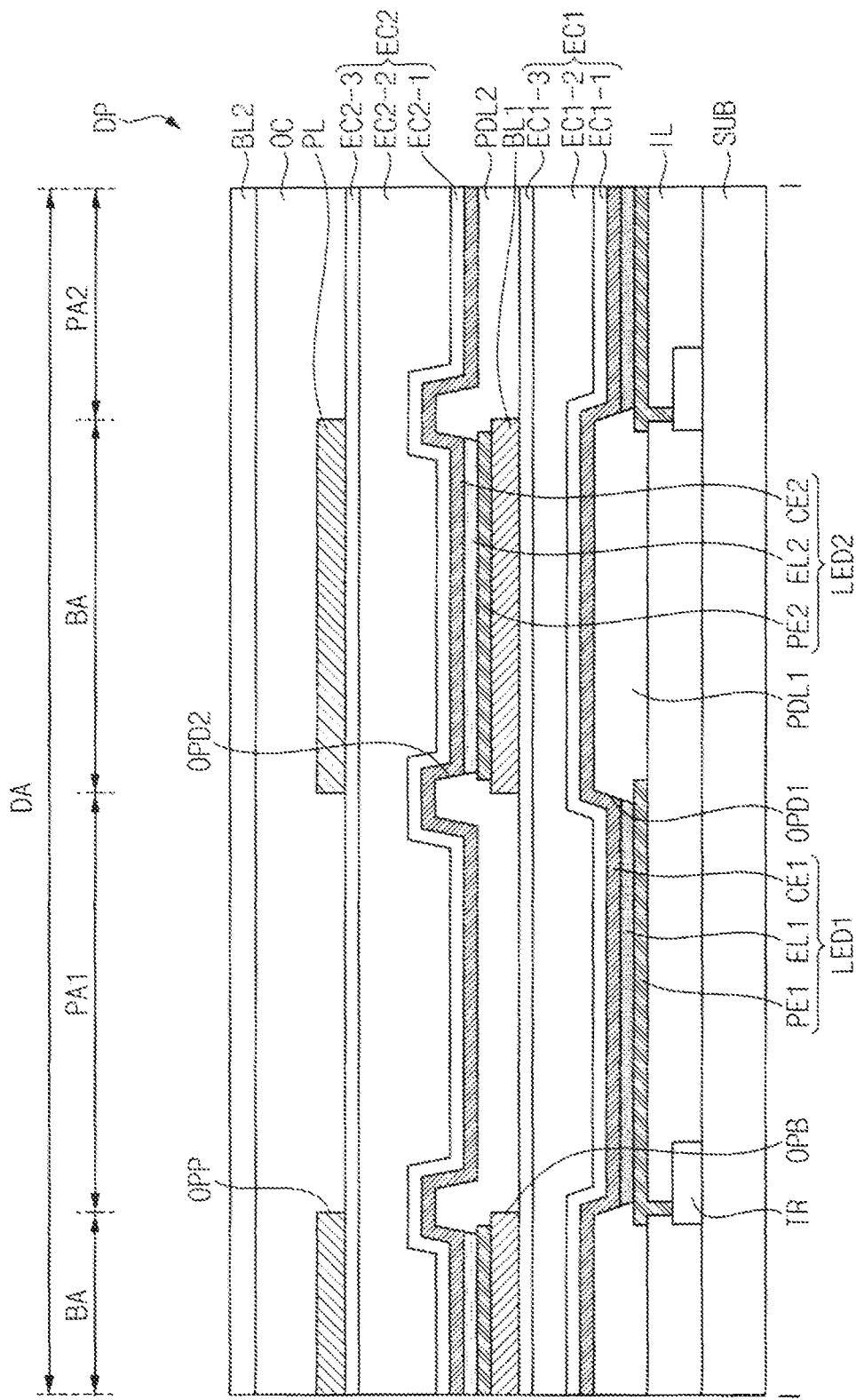
FIG. 3 is a sectional view taken along line I-I' of FIG. 2.
Figure 4:
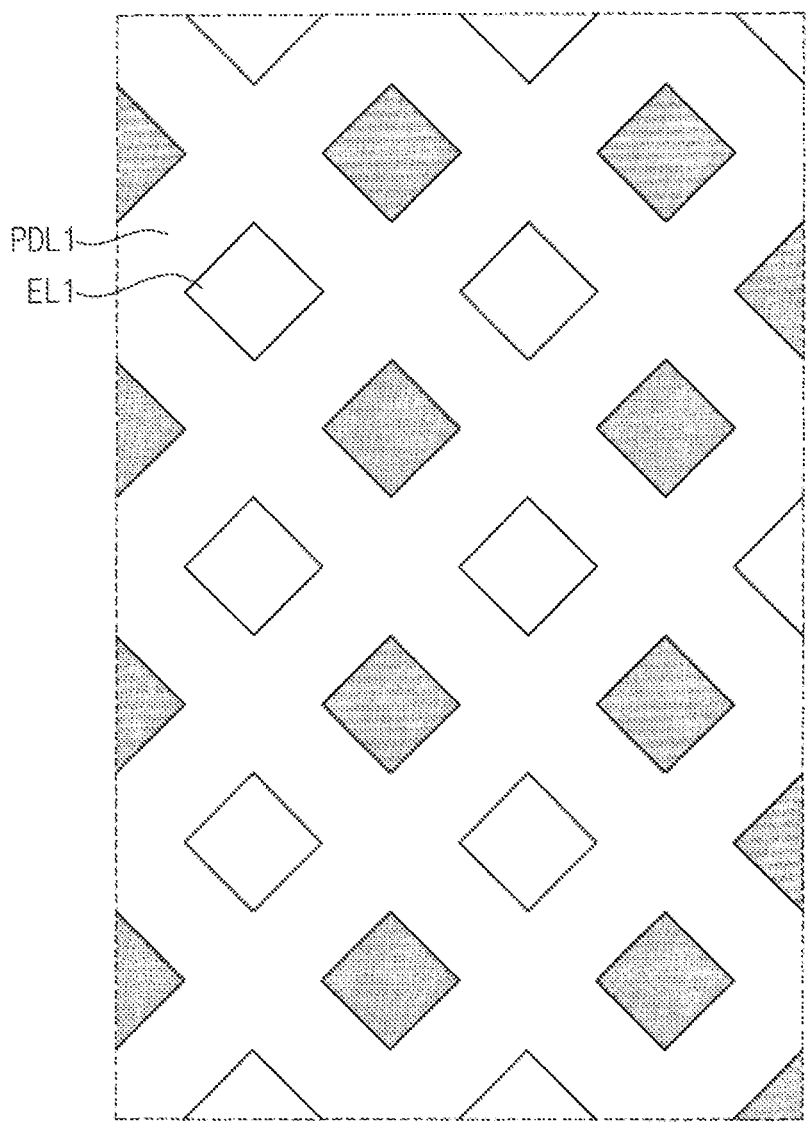
FIG. 4 is a plan view illustrating a first pixel defining layer and a first light emitting layer included in the display panel of FIG. 3.
Figure 5:
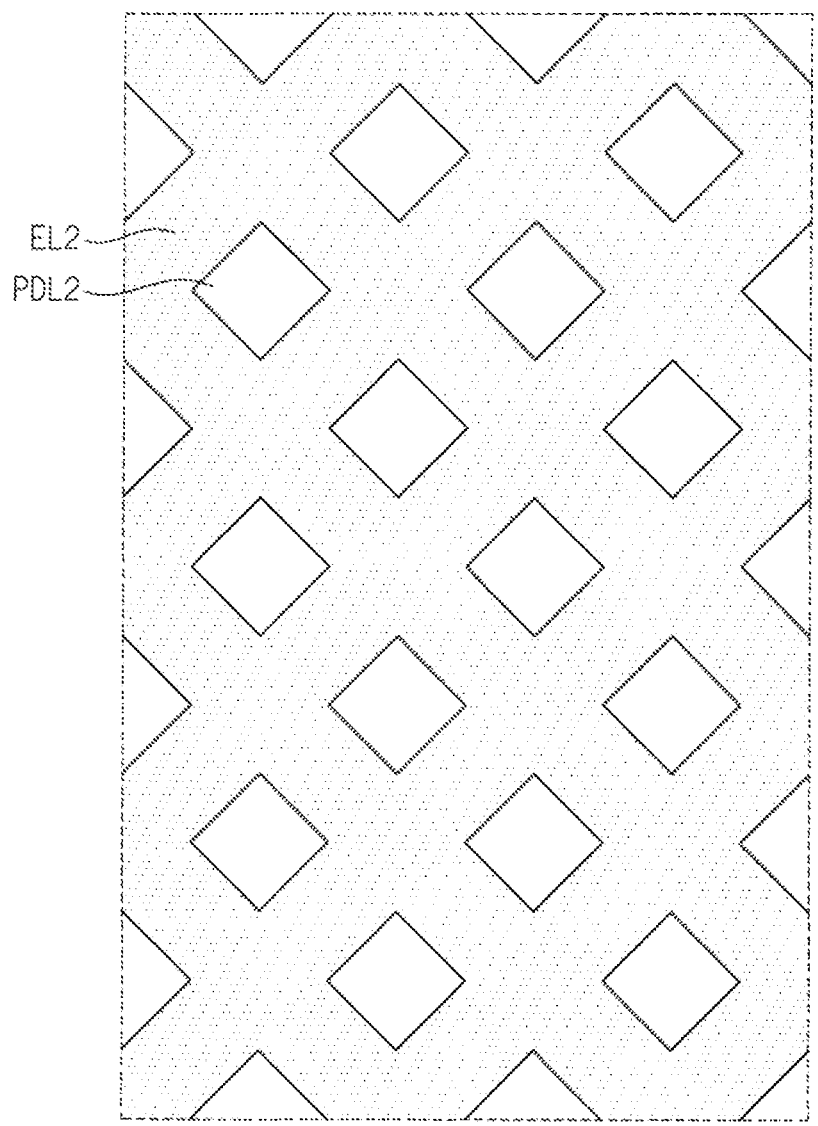
FIG. 5 is a plan view illustrating a second pixel defining layer and a second light emitting layer included in the display panel of FIG. 3.

FIG. 3 is a sectional view taken along line of FIG. 2. FIG. 4 is a plan view illustrating a first pixel defining layer PDL1 and a first light emitting layer EL1 included in the display panel DP of FIG. 3. FIG. 5 is a plan view illustrating a second pixel defining layer PDL2 and a second light emitting layer EL2 included in the display panel DP of FIG. 3. For example, FIGS. 4 and 5 may correspond to the plan view of FIG. 2.

Referring to FIGS. 1 to 5, according to an embodiment, the display panel DP may include a substrate SUB, a transistor TR, an insulating structure IL (e.g., insulating layer), a first light emitting device LED1, a first pixel defining layer PDL1, a first encapsulation layer EC1, a first light blocking layer BL1, a second light emitting device LED2, a second pixel defining layer PDL2, a second encapsulation layer EC2, and a discoloration layer PL.

Each of the first light emitting device LED1 and the second light emitting device LED2 may include an organic light emitting diode, an inorganic light emitting diode, a quantum dot light emitting diode, or the like, as a light emitting element. Hereinafter, the description will be made based on an example in which each of the first light emitting device LED1 and the second light emitting device LED2 is an organic light emitting diode, but the present disclosure is not limited thereto.

The substrate SUB may be an insulating substrate formed of (or including) a transparent or opaque material. In an embodiment, the substrate SUB may include glass. In this case, the display panel DP may be a rigid display panel. In an embodiment, the substrate SUB may include plastic. In this case, the display panel DP may be a flexible display panel.

A plurality of first light emitting devices LED1 may be disposed in the display area DA, on the substrate SUB. The first light emitting devices LED1 may be disposed in the first to third pixel areas PA1, PA2, and PA3, on the substrate SUB, respectively.

In an embodiment, the first light emitting devices LED1 may be an active matrix (AM) type. That is, each of the first light emitting devices LED1 may be electrically connected to at least one transistor TR. The transistor TR may control the corresponding first light emitting device LED1 based on a driving signal provided from a first driving unit (not shown). For example, the first driving unit may be disposed in the non-display area NDA, on the substrate SUB.

The transistor TR may be disposed in the display area DA, on the substrate SUB, and may be covered with the insulating structure IL. A channel layer of the transistor TR may include an oxide semiconductor, a silicon semiconductor, an organic semiconductor, or the like. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like. The insulating structure IL may include an inorganic insulating layer, an organic insulating layer, or a combination thereof.

Each of the first light emitting devices LED1 may include a first pixel electrode PE1, a first light emitting layer EL1, and a first common electrode CE1.

The first pixel electrode PE1 may be disposed on the insulating structure IL. The first pixel electrode PE1 may include a conductive material such as a metal, an alloy, a conductive metal nitride, a conductive metal oxide, or a transparent conductive material. The first pixel electrode PE1 may be electrically connected to the transistor TR through a contact hole formed in (or provided in) the insulating structure IL.

In an embodiment, the plurality of first pixel electrodes PE1 may be disposed in the form of an island pattern (e.g., a discrete shape or pattern) and overlap (or corresponding to) the first to third pixel areas PA1, PA2, and PA3, respectively, in a plan view.

The first pixel defining layer PDL1 may be disposed on the first pixel electrode PE1. The first pixel defining layer PDL1 may include an organic insulating material. Examples of the organic insulating material include photoresist, polyacryl-based resin, polyimide-based resin, polyamide-based resin, siloxane-based resin, acryl-based resin, epoxy-based resin, or the like. The above elements may be used alone or in combination with each other. In an embodiment, the first pixel defining layer PDL1 may further include a light blocking material such as a black pigment, a black dye, or a carbon black.

In an embodiment, as shown in FIGS. 2 and 4, the first pixel defining layer PDL1 may have a shape corresponding to a shape of the light blocking area BA, in a plan view. That is, the first pixel defining layer PDL1 may have a planar shape (e.g., in a plan view) of a lattice shape surrounding each of the first to third pixel areas PA1, PA2, and PA3 in a plan view.

The first pixel defining layer PDL1 may expose a portion (for example, a central portion) of the first pixel electrode PE1 to outside the first pixel defining layer PDL1. For example, the first pixel defining layer PDL1 may have (or define) a first pixel opening OPD1 configured to expose a portion of the first pixel electrode PE1. Each of the first to third pixel areas PA1, PA2, and PA3 may be defined by the first pixel opening OPD1 defined by the first pixel defining layer PDL1.

The first light emitting layer EL1 may be disposed on the first pixel electrode PE1. The first light emitting layer EL1 may be disposed on the portion of the first pixel electrode PE1 exposed by the first pixel opening OPD1 of the first pixel defining layer PDL1.

In an embodiment, as shown in FIGS. 2 and 4, the plurality of first light emitting layers EL1 may be disposed in the form of an island pattern and overlap the first to third pixel areas PA1, PA2, and PA3, respectively, in a plan view.

The first light emitting layer EL1 may include an organic light emitting material that emits the first light L1 having the first wavelength range. The organic light emitting material may emit any one of the red light, green light, and blue light. For example, the first light emitting layer EL1 disposed in the first pixel area PA1 may include an organic light emitting material that emits the red light, the first light emitting layer EL1 disposed in the second pixel area PA2 may include an organic light emitting material that emits the green light, and the first light emitting layer EL1 disposed in the third pixel area PA3 may include an organic light emitting material that emits the blue light.

The first common electrode CE1 may be disposed on the first light emitting layer EL1. The first common electrode CE1 may include a conductive material and may have light-transmitting properties. For example, the first common electrode CE1 may include a transparent conductive material such as an indium tin oxide (ITO). As another example, the first common electrode CE1 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu) or an alloy containing at least one of the above elements. As a specific example, the first common electrode CE1 may include Ag:Mg. When the first common electrode CE1 includes a metal or an alloy, the first common electrode CE1 may be configured with a thin thickness (for example, a thickness of about 10 nm or less) to have a light-transmitting property.

The first common electrode CE1 may also be disposed on the first pixel defining layer PDL1. In an embodiment, the first common electrode CE1 may entirely overlap (e.g., may overlap or correspond to an entirety of) the first to third pixel areas PA1, PA2, and PA3 and the light blocking area BA.

The first encapsulation layer EC1 may cover the first light emitting device LED1. The first encapsulation layer EC1 may entirely overlap the first to third pixel areas PA1, PA2, and PA3 and the light blocking area BA.

In an embodiment, the first encapsulation layer EC1 may have a structure in which at least one inorganic layer and at least one organic layer are stacked on each other (e.g., facing each other). For example, the first encapsulation layer EC1 may have a structure in which a first inorganic encapsulation layer EC1-1, an organic encapsulation layer EC1-2, and a second inorganic encapsulation layer EC1-3 are alternately stacked.

The first light blocking layer BL1 may be disposed on the first encapsulation layer EC1. The first light blocking layer BL1 may be disposed between the first encapsulation layer EC1 and the second light emitting device LED2. The first light blocking layer BL1 may include an organic material such as a photoresist and a light blocking material such as a black pigment, a black dye, or a carbon black. For example, the first light blocking layer BL1 may include a black matrix.

In an embodiment, the first light blocking layer BL1 may have a shape corresponding to a shape of the light blocking area BA in a plan view. That is, the first light blocking layer BL1 may have a lattice shape surrounding each of the first to third pixel areas PA1, PA2, and PA3 in a plan view. The first light blocking layer BL1 may prevent the red light, green light, and blue light emitted from the first to third pixel areas PA1, PA2, and PA3 from being mixed with each other.

The first light blocking layer BL1 may have a light blocking layer opening OPB configured to expose each of the first to third pixel areas PA1, PA2, and PA3 to outside the first light blocking layer BL1. The light blocking layer opening OPB of the first light blocking layer BL1 may correspond to a first pixel opening OPD1 of the first pixel defining layer PDL1.

A dimension (e.g., a width) of a feature may be taken in a direction along a plane, such as along the substrate SUB. In an embodiment, a width of the light blocking layer opening OPB of the first light blocking layer BL1 may be substantially the same as a width of the first pixel opening OPD1 of the first pixel defining layer PDL1. In an embodiment, a width of the light blocking layer opening OPB of the first light blocking layer BL1 may be greater than a width of the first pixel opening OPD1 of the first pixel defining layer PDL1. That is, a width of the first light blocking layer BL1 may be smaller than a width of a pattern in the first pixel defining layer PDL1.

The second light emitting device LED2 may be disposed on the first light blocking layer BL1. That is, the second light emitting device LED2 may be disposed on the first encapsulation layer EC1. In other words, the second light emitting device LED2 may be spaced apart from the first light emitting device LED1 along the thickness direction with the first encapsulation layer EC1 interposed therebetween. The second light emitting device LED2 may be further from the substrate SUB than the first light emitting device LED1, so as to be in different planes from each other (e.g., non-coplanar). For example, the second light emitting device LED2 may entirely overlap the light blocking area BA.

In an embodiment, the second light emitting device LED2 may be a passive matrix (PM) type. The second light emitting device LED2 may include a second pixel electrode PE2, a second light emitting layer EL2, and a second common electrode CE2.

The second pixel electrode PE2 may be disposed on the first light blocking layer BL1. The second pixel electrode PE2 may include a conductive material.

In an embodiment, the second pixel electrode PE2 may have a shape corresponding to a shape of the light blocking area BA in a plan view. That is, the second pixel electrode PE2 may have a lattice shape surrounding each of the first to third pixel areas PA1, PA2, and PA3 in a plan view.

In an embodiment, the second pixel electrode PE2 may include a transparent conductive material such as an indium tin oxide (ITO).

In an embodiment, the second pixel electrode PE2 may include a conductive material such as an opaque metal or an alloy. In this case, the first light blocking layer BL1 may be omitted, and the second pixel electrode PE2 may serve to prevent the red light, green light, and blue light emitted from the first to third pixel areas PA1, PA2, and PA3 from being mixed with each other.

The second pixel defining layer PDL2 may be disposed on the second pixel electrode PE2. The second pixel defining layer PDL2 may include an organic insulating material. The second pixel defining layer PDL2 may expose a portion of the second pixel electrode PE2 to outside the second pixel defining layer PDL2. For example, the second pixel defining layer PDL2 may have a second pixel opening OPD2 configured to expose a portion of the second pixel electrode PE2 to outside the second pixel defining layer PDL2.

In an embodiment, the second pixel opening OPD2 of the second pixel defining layer PDL2 may have a shape corresponding to a shape of the light blocking area BA in a plan view. That is, as shown in FIGS. 2 and 5, the second pixel defining layer PDL2 may be disposed in the form of an island pattern and overlap the first to third pixel areas PA1, PA2, and PA3, respectively, in a plan view.

The second light emitting layer EL2 may be disposed on the second pixel electrode PE2. The second light emitting layer EL2 may be disposed on the portion of the second pixel electrode PE2 exposed by the second pixel opening OPD2 of the second pixel defining layer PDL2. The second light emitting layer EL2 may include an organic light emitting material that emits the second light L2 having the second wavelength range.

In an embodiment, as shown in FIGS. 2 and 5, the second light emitting layer EL2 may have a shape corresponding to a shape of the light blocking area BA in a plan view. That is, the second light emitting layer EL2 may have a lattice shape surrounding each of the first to third pixel areas PA1, PA2, and PA3 in a plan view.

The second common electrode CE2 may be disposed on the second light emitting layer EL2. The second common electrode CE2 may include a conductive material and may have light-transmitting properties. For example, the second common electrode CE2 may include a transparent conductive material such as an indium tin oxide (ITO). As another example, the second common electrode CE2 may include a metal such as Au, Ag, Al, Pt, Ni, Ti, Pd, Mg, Ca, Li, Cr, Ta, W, Cu, or an alloy of at least one of the above element. As a specific example, the second common electrode CE2 may include Ag:Mg. When the second common electrode CE2 includes a metal or an alloy, the second common electrode CE2 may be configured with a thin thickness (for example, a thickness of about 10 nm or less) to have a light-transmitting property.

The second common electrode CE2 may also be disposed on the second pixel defining layer PDL2. In an embodiment, the second common electrode CE2 may entirely overlap the first to third pixel areas PA1, PA2, and PA3 and the light blocking area BA.

The second light emitting device LED2 may emit the second light L2 based on a driving signal provided from a second driving unit (not shown). In an embodiment, the second driving unit may control the second light emitting device LED2 to selectively emit the second light L2 only in the second mode. For example, the second driving unit may be disposed in the non-display area NDA, on the substrate SUB.

The second encapsulation layer EC2 may cover the second light emitting device LED2. The second encapsulation layer EC2 may entirely overlap the first to third pixel areas PA1, PA2, and PA3 and the light blocking area BA.

In an embodiment, the second encapsulation layer EC2 may have a structure in which at least one inorganic layer and at least one organic layer are stacked on each other. For example, the second encapsulation layer EC2 may have a structure in which a third inorganic encapsulation layer EC2-1, an organic encapsulation layer EC2-2, and a fourth inorganic encapsulation layer EC2-3 are alternately stacked with each other.

The discoloration layer PL may be disposed on the second encapsulation layer EC2. The discoloration layer PL may include a photochromic material that is discolored by the second light L2 (for example, ultraviolet light) having the second wavelength range. That is, the discoloration layer PL may be color-changeable or include a material having a color which is changeable to be discolored. The discoloration layer PL which has the color (e.g., a first state) transmits light, while the discoloration layer PL with is discolored from the color (e.g., a second state) absorbs or blocks light. The photochromic material may not be discolored by the first light L1 (for example, visible light) having the first wavelength range. In addition, the photochromic material may transmit the first light L1 in a state in which the photochromic material is not discolored by the second light L2. The photochromic material may absorb the first light L1 to block the transmission of the first light L1 in a state in which the photochromic material is discolored by the second light L2. For example, the photochromic material may have a transmittance of about 10% or less with respect to the first light L1 in a state in which the photochromic material is discolored by the second light L2. For example, the photochromic material may include azobenzene, spiropyran, diallylethene, or the like, but these elements are illustrative purposes only and the present disclosure is not limited thereto.

In an embodiment, the discoloration layer PL may have a shape corresponding to a shape of the light blocking area BA in a plan view. That is, the discoloration layer PL may have a lattice shape surrounding each of the first to third pixel areas PA1, PA2, and PA3 in a plan view. For example, the first pixel defining layer PDL1, the first light blocking layer BL1, the second pixel electrode PE2, the second light emitting layer EL2, and the discoloration layer PL may have shapes corresponding to each other in a plan view. Solid portions of the first pixel defining layer PDL1, the first light blocking layer BL1, the second pixel electrode PE2, the second light emitting layer EL2, and the discoloration layer PL may define patterns (e.g., a light blocking pattern provided in plural) which are aligned with each other along the thickness direction. The discoloration layer PL may be furthest from light emitting elements among light blocking patterns provided by the first light blocking layer BL1, the second pixel electrode PE2 and the second light emitting layer EL2.

The discoloration layer PL may have a color-changeable layer opening OPP that exposes each of the first to third pixel areas PA1, PA2, and PA3 to outside the discoloration layer PL. The color-changeable layer opening OPP of the discoloration layer PL may correspond to the first pixel opening OPD1 of the first pixel defining layer PDL1 and the light blocking layer opening OPB of the first light blocking layer BL1.

In an embodiment, a width of the color-changeable layer opening OPP of the discoloration layer PL may be substantially the same as a width of the light blocking layer opening OPB of the first light blocking layer BL1.

In an embodiment, a width of the color-changeable layer opening OPP of the discoloration layer PL may be smaller than a width of the light blocking layer opening OPB of the first light blocking layer BL1. That is, a pattern (e.g., solid portion) of the width of the discoloration layer PL may be greater than the width of the first light blocking layer BL1. For example, the discoloration layer PL may expose a central portion of each of the first to third pixel areas PA1, PA2, and PA3, and may overlap a peripheral portion of each of the first to third pixel areas PA1, PA2, and PA3. In this case, in the second mode in which the discoloration layer PL is discolored by the second light L2 to implement a narrow viewing angle, the viewing angle of the display panel DP may be further narrowed.

In an embodiment, the display panel DP may further include a planarization layer OC that covers the discoloration layer PL and the second encapsulation layer EC2. The planarization layer OC may include an organic material. The planarization layer OC may provide a substantially flat top surface.

In an embodiment, the display panel DP may further include a second light blocking layer BL2 disposed on the discoloration layer PL. The second light blocking layer BL2 may selectively block the second light L2 having the second wavelength range. That is, the second light blocking layer BL2 may transmit the first light L1 having the first wavelength range. The second light blocking layer BL2 may prevent the second light L2 emitted from the second light emitting device LED2 from being emitted to the outside of the display panel DP. For example, the second light blocking layer BL2 may be disposed on the planarization layer OC.

In an embodiment, the second light blocking layer BL2 may have a distributed Bragg reflector (DBR) structure. For example, the second light blocking layer BL2 may have a structure in which at least one first inorganic layer and at least one second inorganic layer which has a refractive index different from that of the first inorganic layer, are stacked.

In an embodiment, the second light blocking layer BL2 may have a structure in which a blocking material such as metal oxide particles or benzoxazine particles is dispersed in an organic layer. For example, the metal oxide may include a zinc oxide (ZnOx). The zinc oxide (ZnOx) may be a zinc oxide (ZnO) and/or a zinc peroxide (ZnO2).

In an embodiment, although not shown in the drawings, the display panel DP may further include various functional layers (for example, a touch sensing layer, a color filter layer, a polarizing layer, a window, or the like) disposed on the second encapsulation layer EC2.

Figure 6A:
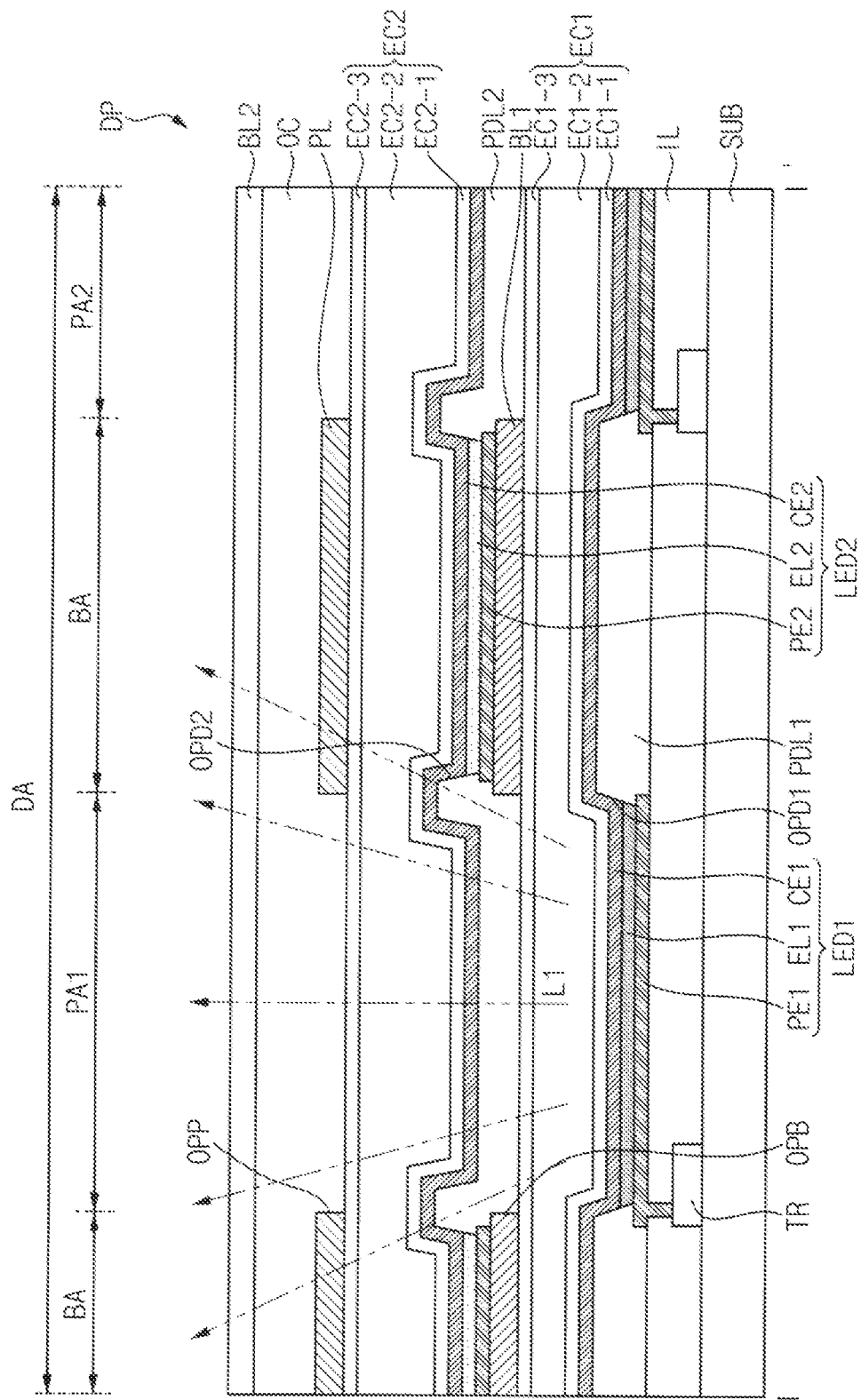
FIGS. 6A and 6B are sectional views for explaining an operation of the display panel of FIG. 3.
Figure 6B:
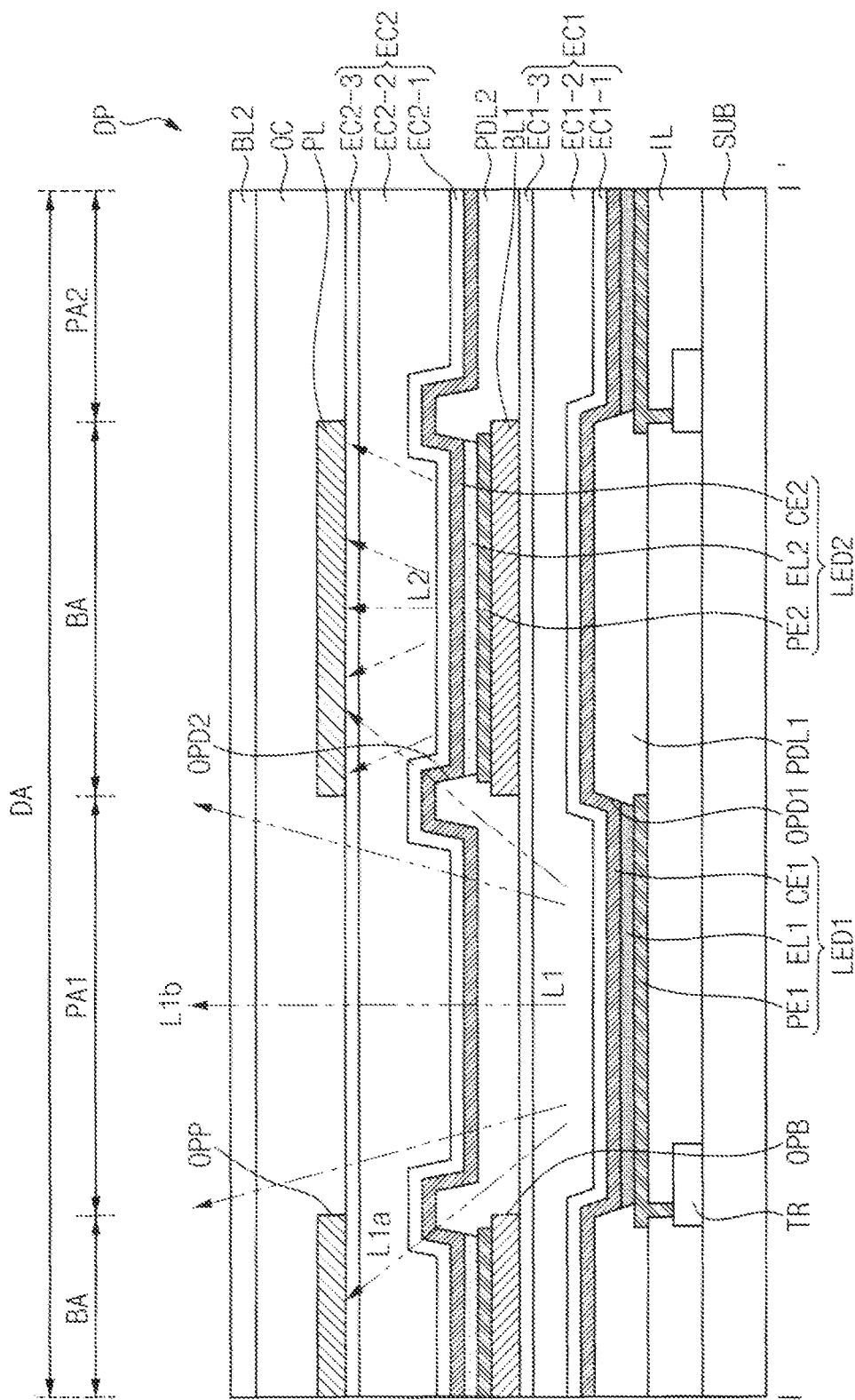

FIGS. 6A and 6B are sectional views for explaining an operation of the display panel DP of FIG. 3. For example, each of FIGS. 6A and 6B may correspond to the sectional view of FIG. 3.

Hereinafter, an operation of the display panel DP in the first mode for implementing a wide viewing angle and the second mode for implementing a narrow viewing angle will be described with reference to FIGS. 6A and 6B.

As shown in FIG. 6A, the display panel DP may be driven in the first mode for implementing the wide viewing angle. In the first mode, the first driving unit may drive the first light emitting device LED1, and the second driving unit may not drive the second light emitting device LED2. Accordingly, a first light L1 (for example, visible light) having the first wavelength range may be emitted from the first light emitting device LED1, and a second light L2 having the second wavelength range may not be emitted from the second light emitting device LED2. Accordingly, the discoloration layer PL may not be discolored. Thus, the discoloration layer PL may transmit the first light L1. That is, the first light L1 emitted from each of the first to third pixel areas PA1, PA2, and PA3 may be emitted to the outside of the display panel DP without being blocked by the discoloration layer PL. Accordingly, the display panel DP may display an image with a wide viewing angle. That is, the discoloration layer PL which has the color (e.g., is not discolored) and disposes the display panel DP having a changeable viewing angle to have a wide viewing angle.

As shown in FIG. 6B, the display panel DP may be switched to the second mode for implementing a narrow viewing angle. In the second mode, the second driving unit may drive the second light emitting device LED2. Accordingly, the second light L2 may be emitted from the second light emitting device LED2. In this case, the discoloration layer PL may be discolored by the second light L2. Thus, among the first light L1 emitted from each of the first to third pixel areas PA1, PA2, and PA3, a first-sub light L1a travelling toward the discoloration layer PL may be blocked by the discoloration layer PL. Among the first light L1 emitted from each of the first to third pixel areas PA1, PA2, and PA3, a second-sub light L1b travelling toward the color-changeable layer opening OPP of the discoloration layer PL may be emitted to the outside of the display panel DP without being blocked by colored-changed pattern of the discoloration layer PL. An angle of the first-sub light L1a is greater than an angle of the second-sub light L1b. That is, when the display panel DP is driven in the second mode, the discoloration layer PL may block a first-sub light L1a having a viewing angle greater than or equal to a predetermined angle among the first light L1 emitted from each of the first to third pixel areas PA1, PA2, and PA3. Accordingly, the display panel DP may display an image with a narrow viewing angle. Therefore, the discoloration layer PL which is discolored disposes the display panel DP having a changeable viewing angle to have a narrow viewing angle.

When the display panel DP is switched back to the first mode for implementing a wide viewing angle (FIG. 6A), the second driving unit may not drive the second light emitting device LED2. Accordingly, the second light L2 is not emitted from the second light emitting device LED2, and the color of the discoloration layer PL may be restored to the original color or state thereof. Therefore, the discoloration layer PL may transmit the first light L1 again, and the display panel DP may display an image again with a wide viewing angle.

Figure 7:
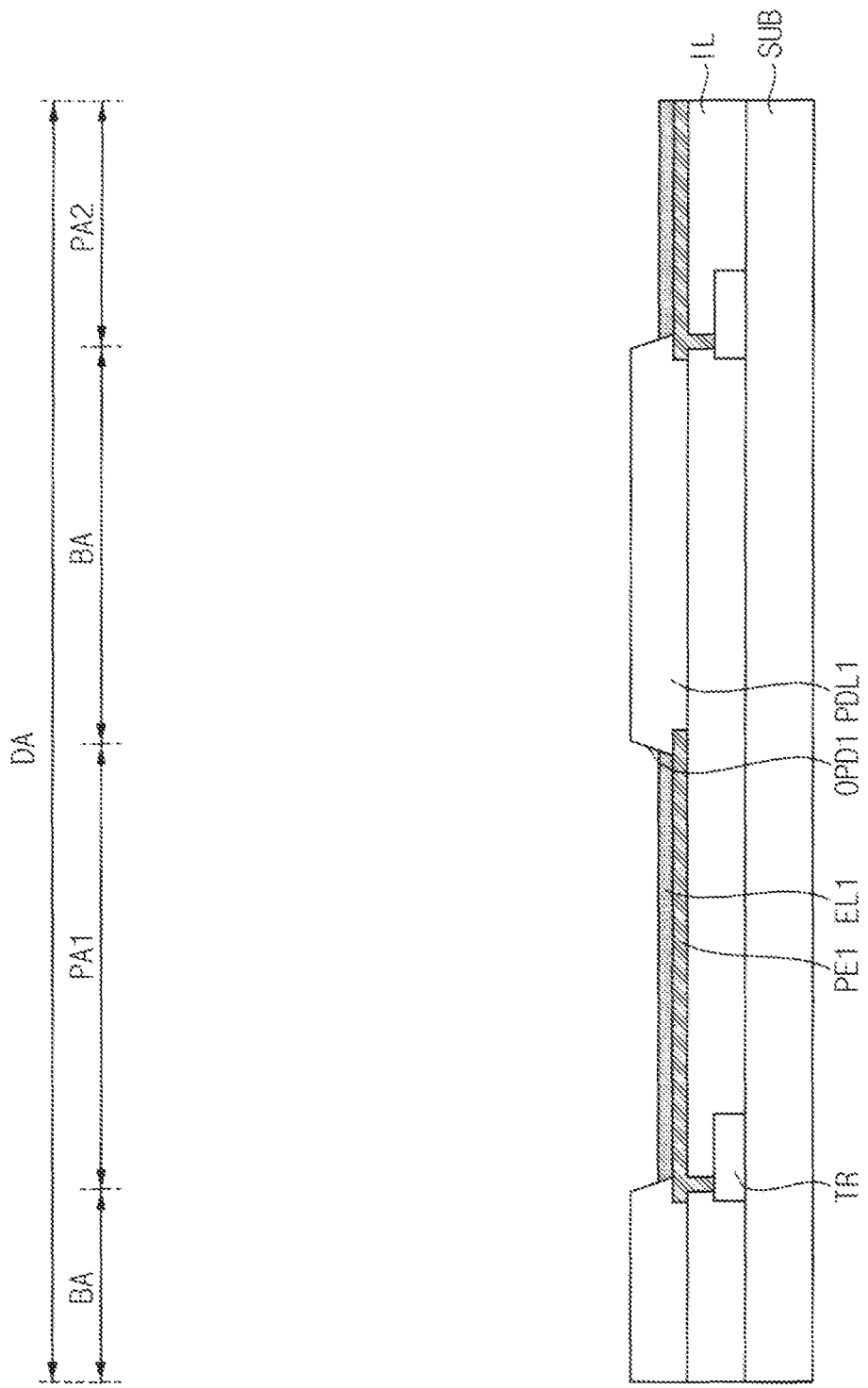
FIGS. 7 to 9 are sectional views illustrating a method of manufacturing (or providing) the display panel of FIG. 3.
Figure 8:
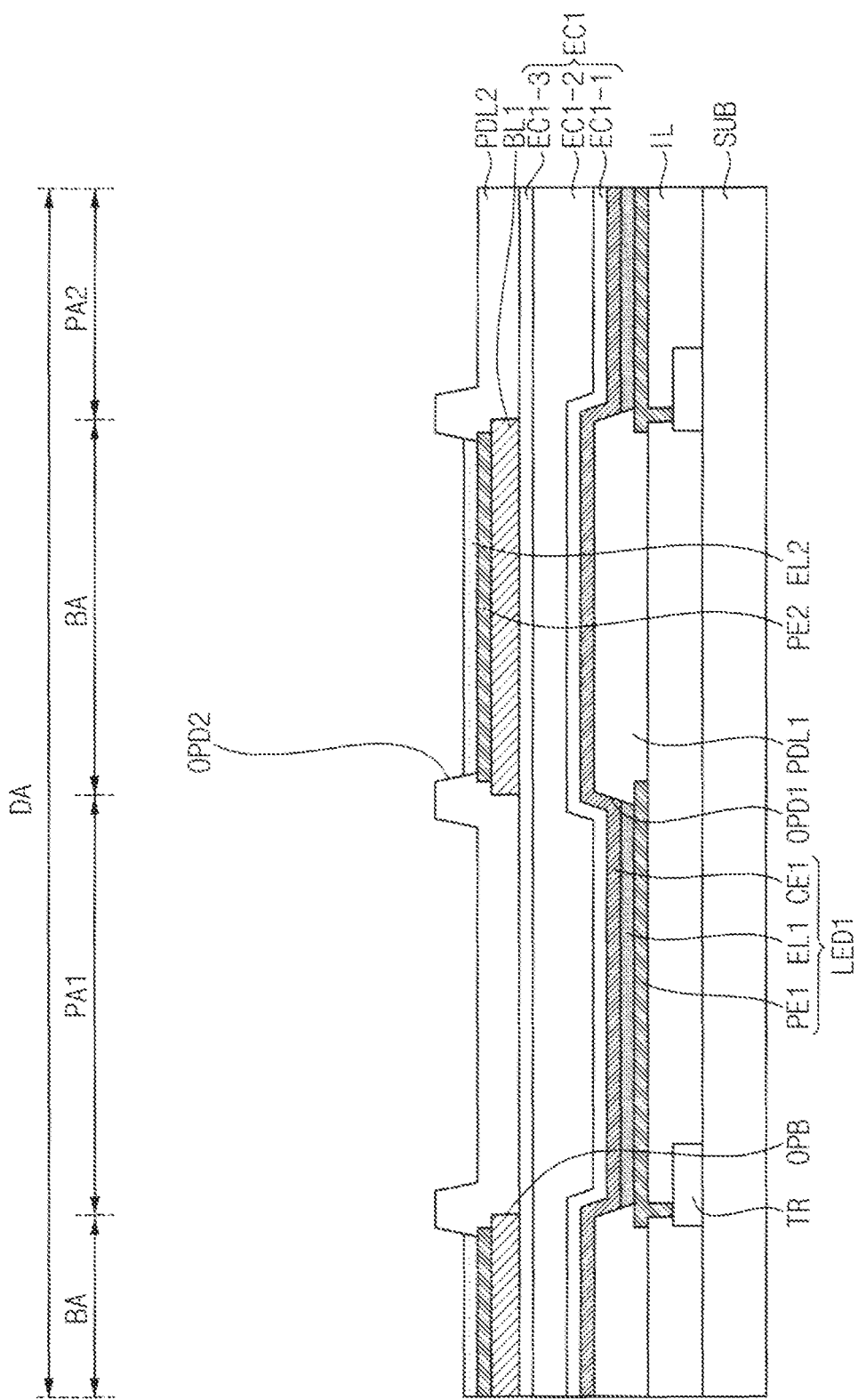
Figure 9:
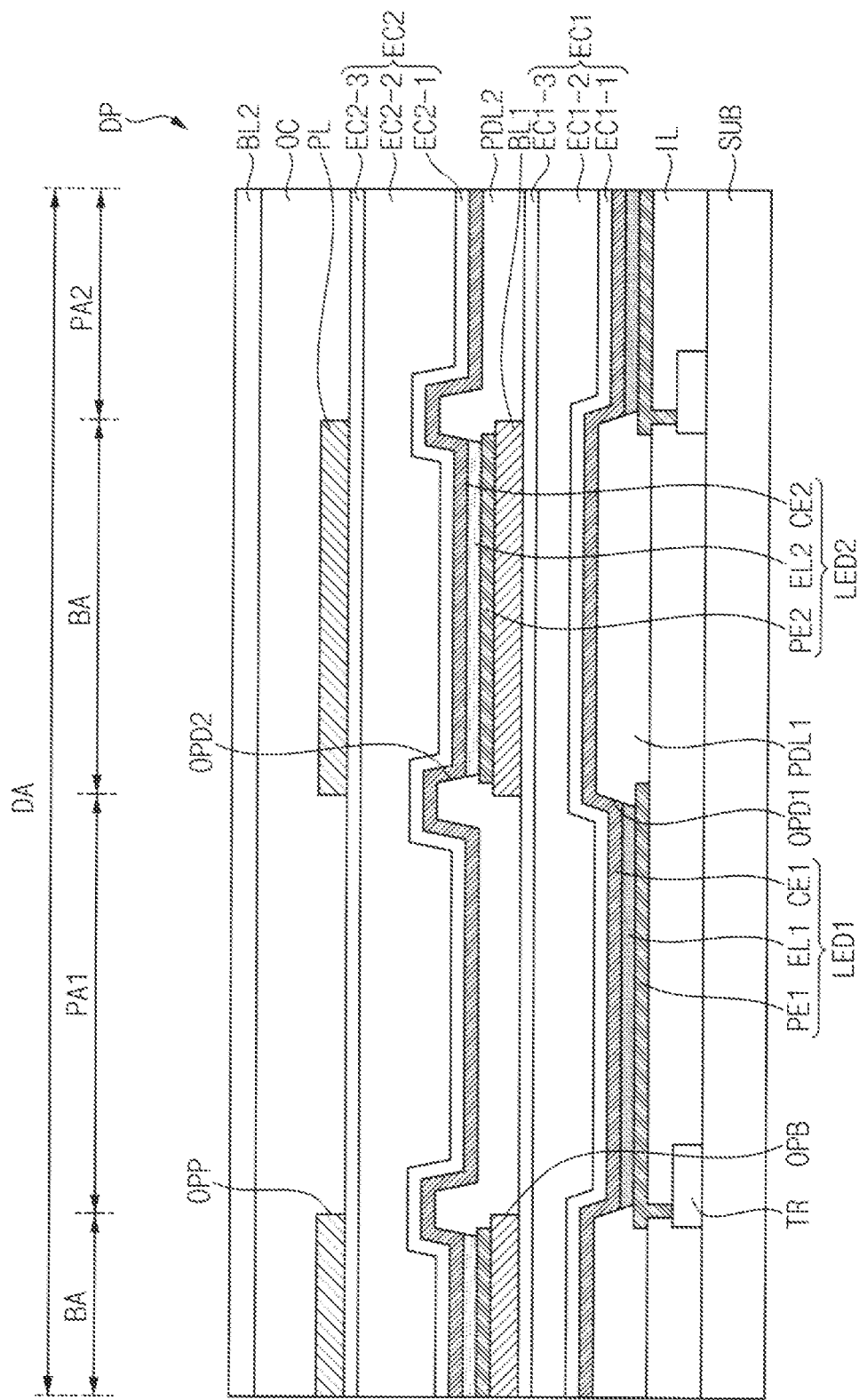

FIGS. 7 to 9 are sectional views illustrating a method of manufacturing (or providing) the display panel DP of FIG. 3.

Hereinafter, the method of manufacturing (or providing) the display panel DP of FIG. 3 will be briefly described with reference to FIGS. 7 to 9, and repeated descriptions will be omitted or simplified.

Referring to FIG. 7, the transistor TR may be formed (or provided) in the display area DA, on the substrate SUB, and the insulating structure IL that covers the transistor TR may be formed. Subsequently, a contact hole may be formed (or defined) in the insulating structure IL to overlap the transistor TR.

The first pixel electrode PE1 may be formed to overlap the contact hole. In an embodiment, a conductive layer may be formed on the insulating structure IL using a conductive material. Next, the conductive layer may be partially removed to form the first pixel electrode PE1 that overlaps each of the first to third pixel areas PA1, PA2, and PA3. In an embodiment, the first pixel electrode PE1 may be formed by a sputtering process using a fine metal mask (FMM), or the like. Hereinafter, the fine metal mask will be referred to as a mask for the purpose of convenience.

The first pixel defining layer PDL1 may be formed on the first pixel electrode PE1. The first pixel defining layer PDL1 may be formed using an organic insulating material. Next, the first pixel defining layer PDL1 may be partially removed to form the first pixel opening OPD1 that exposes a portion (for example, a central portion) of the first pixel electrode PE1.

The first light emitting layer EL1 may be formed in the first pixel opening OPD1 of the first pixel defining layer PDL1. In an embodiment, the first light emitting layer EL1 may be formed through a deposition process using a mask. For example, the first light emitting layer EL1 may be formed by sequentially depositing an organic light emitting material that emits the red light by using a first mask having through holes overlapping the first pixel areas PA1, respectively, an organic light emitting material that emits the green light by using a second mask having through holes overlapping the second pixel areas PA2, respectively, and an organic light emitting material that emits the blue light by using a third mask having through holes overlapping the third pixel areas PA3, respectively.

In an embodiment, the first light emitting layer EL1 may be formed by inkjet printing, laser induced thermal imaging (LITI), or the like.

Referring to FIG. 8, the first common electrode CE1 and the first encapsulation layer EC1 may be formed on the first light emitting layer EL1 and the first pixel defining layer PDL1.

Subsequently, the first light blocking layer BL1 may be formed on the first encapsulation layer EC1. In an embodiment, the first light blocking layer BL1 may have a shape corresponding to a shape of the light blocking area BA in a plan view. That is, the first light blocking layer BL1 may have a lattice shape surrounding each of the first to third pixel areas PA1, PA2, and PA3 in a plan view.

In an embodiment, the first light blocking layer BL1 may be entirely formed on the first encapsulation layer EC1 by using an organic material such as a photoresist and a light blocking material such as a black pigment, a black dye, a carbon black, or the like. Next, the first light blocking layer BL1 may be partially removed to form a light blocking layer opening OPB that exposes each of the first to third pixel areas PA1, PA2, and PA3.

Then, the second pixel electrode PE2 may be formed on the first light blocking layer BL1. In an embodiment, the second pixel electrode PE2 may have a shape corresponding to a shape of the light blocking area BA in a plan view. That is, the second pixel electrode PE2 may have a lattice shape surrounding each of the first to third pixel areas PA1, PA2, and PA3 in a plan view.

In an embodiment, a conductive layer may be formed on the first encapsulation layer EC1 and the first light blocking layer BL1 using a conductive material. Next, the conductive layer may be partially removed to form the second pixel electrode PE2 surrounding each of the first to third pixel areas PA1, PA2, and PA3. In an embodiment, the second pixel electrode PE2 may be formed by a sputtering process using a mask, or the like. In this case, the second pixel electrode PE2 may be formed by a method substantially the same as or similar to the method of forming the second light emitting layer EL2, which will be described below with reference to FIGS. 10A to 12B.

Subsequently, the second pixel defining layer PDL2 may be formed on the second pixel electrode PE2. The second pixel defining layer PDL2 may be formed using an organic insulating material having light-transmitting properties. Then, the second pixel defining layer PDL2 may be partially removed to form the second pixel opening OPD2 that exposes a portion of the second pixel electrode PE2. In an embodiment, the second pixel opening OPD2 of the second pixel defining layer PDL2 may have a shape corresponding to a shape of the light blocking area BA in a plan view. That is, the second pixel defining layer PDL2 may be disposed in the form of an island pattern and overlap the first to third pixel areas PA1, PA2, and PA3, respectively, in a plan view.

The second light emitting layer EL2 may be formed in the second pixel opening OPD2 of the second pixel defining layer PDL2. In an embodiment, the second light emitting layer EL2 may have a shape corresponding to a shape of the light blocking area BA in a plan view. That is, the second light emitting layer EL2 may have a lattice shape surrounding each of the first to third pixel areas PA1, PA2, and PA3 in a plan view.

In an embodiment, the second light emitting layer EL2 may be formed through a deposition process using a mask. In an embodiment, the second light emitting layer EL2 may be formed through various methods such as inkjet printing, laser induced thermal imaging (LITI), or the like.

Figure 11A:
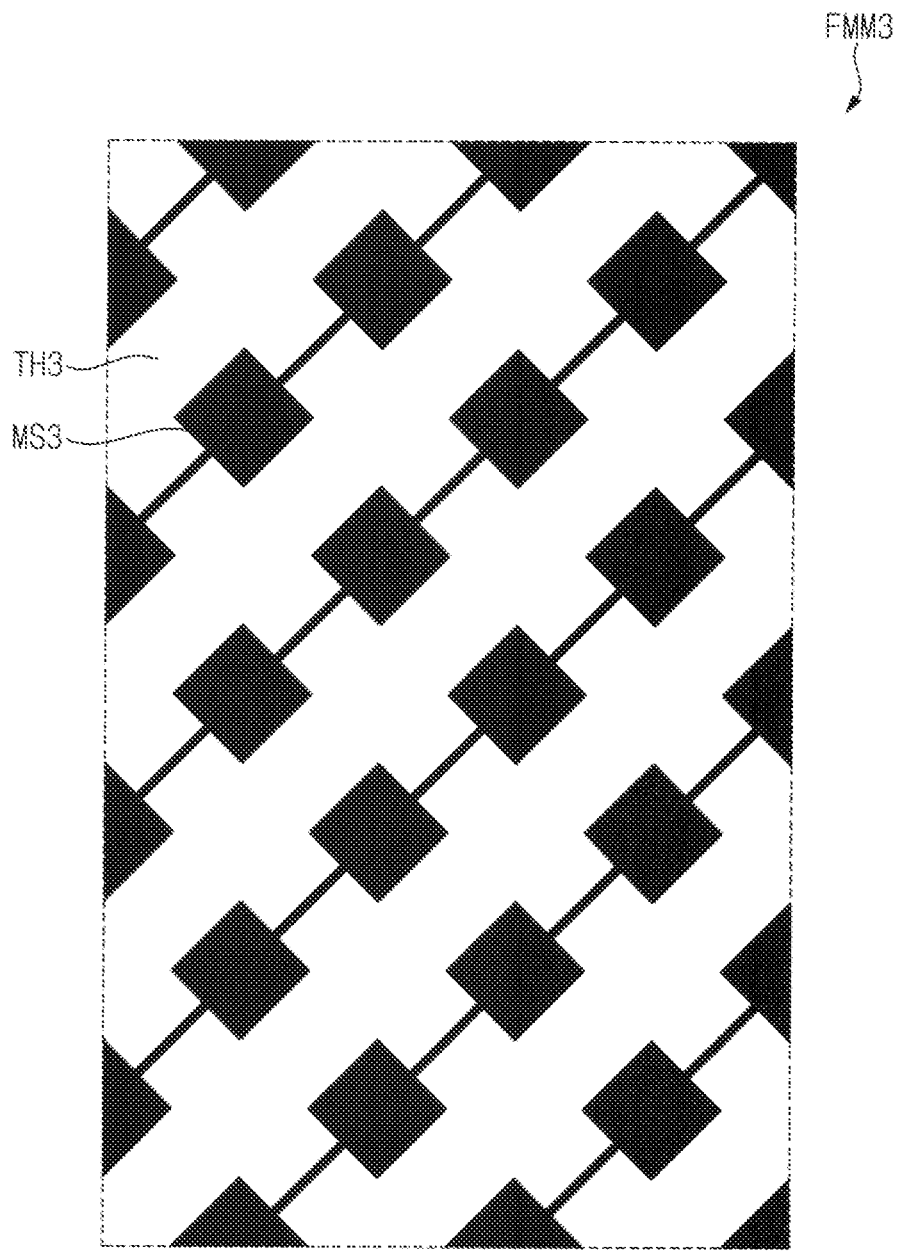
FIGS. 11A and 11B are plan views illustrating an example of the method of forming the second light emitting layer of FIG. 8.
Figure 11B:
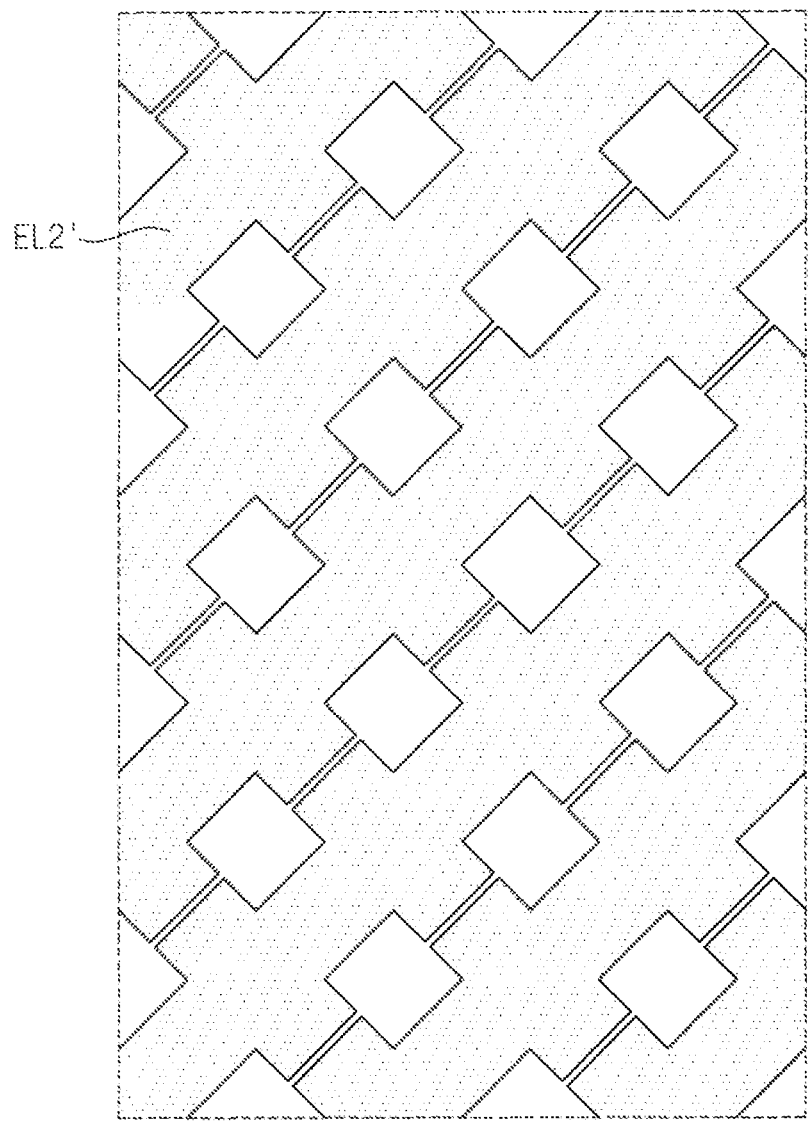
Figure 12A:
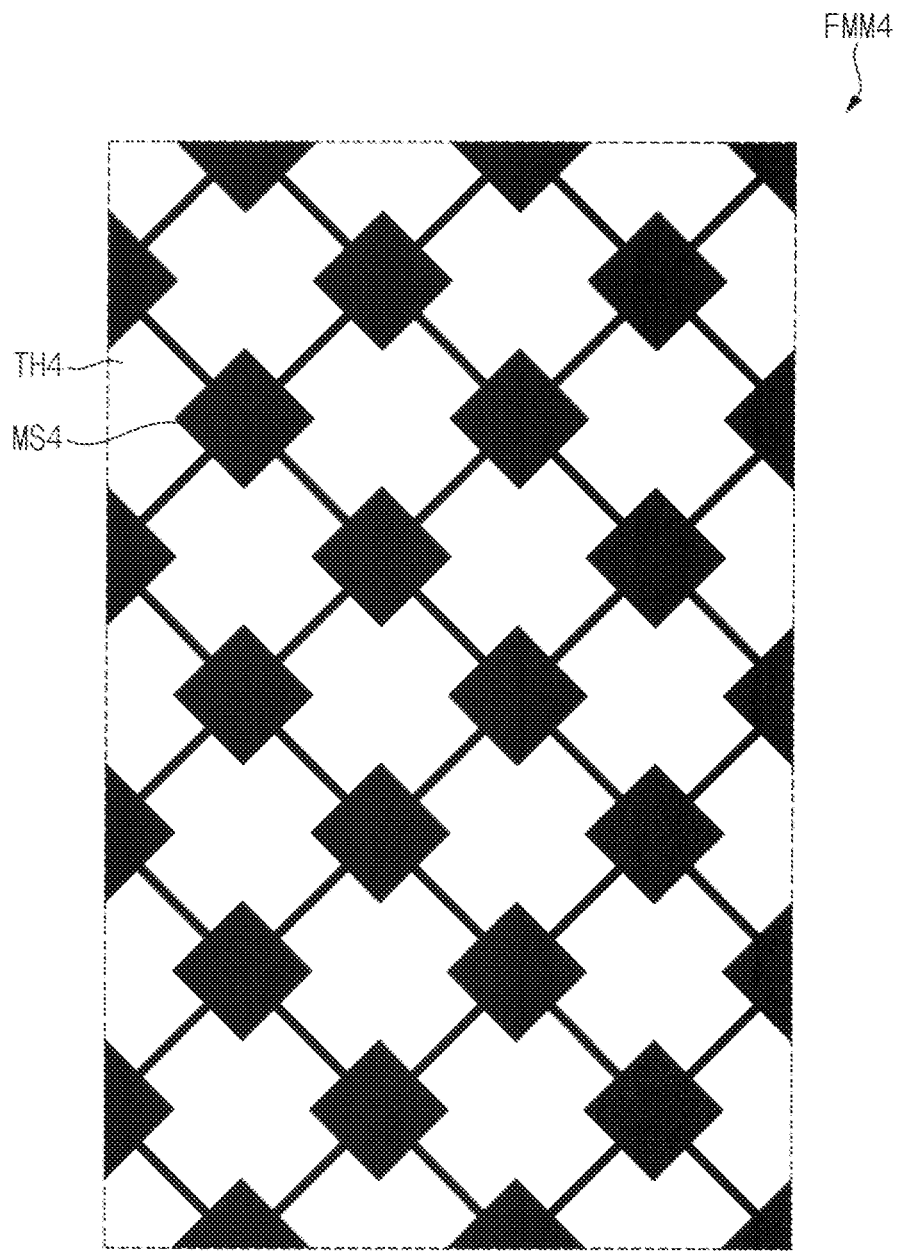
FIGS. 12A and 12B are plan views illustrating an example of the method of forming the second light emitting layer of FIG. 8.
Figure 12B:
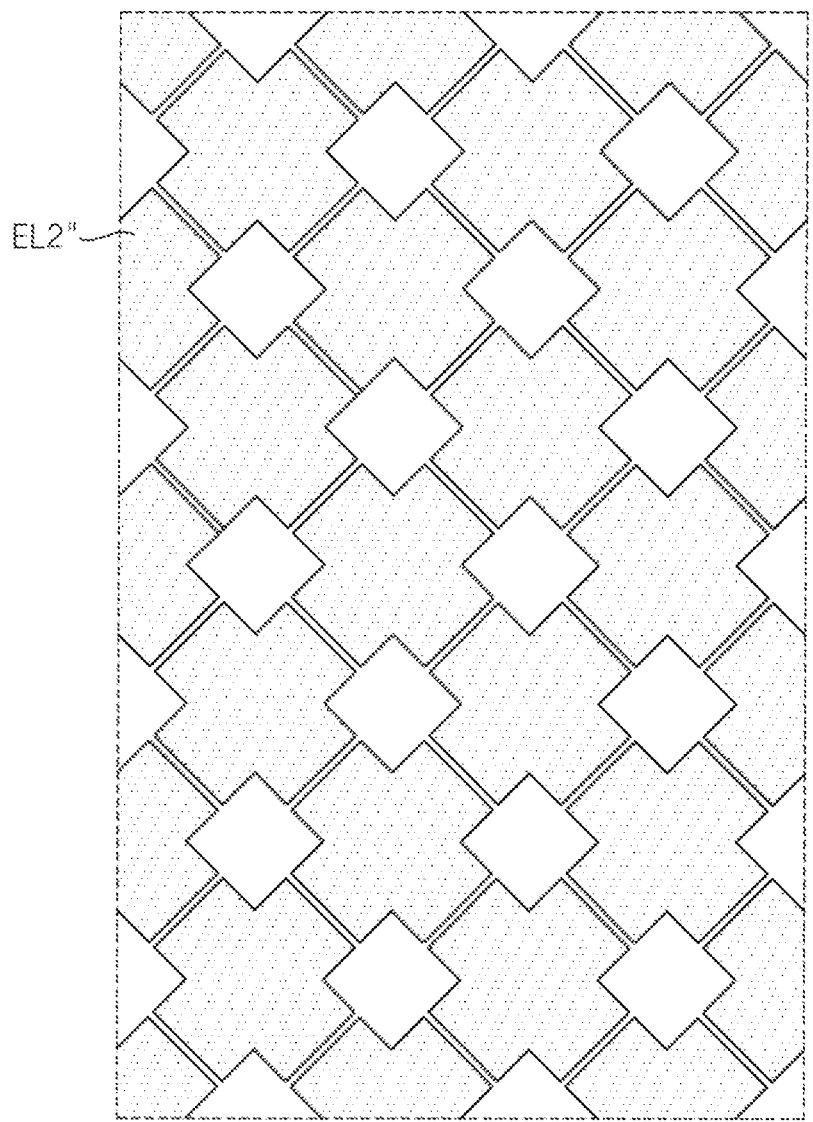

FIGS. 10A to 10D are plan views illustrating an example of a method of forming the second light emitting layer EL2 of FIG. 8. FIGS. 11A and 11B are plan views illustrating an example of the method of forming the second light emitting layer EL2 of FIG. 8. FIGS. 12A and 12B are plan views illustrating an example of the method of forming the second light emitting layer EL2 of FIG. 8. For example, each of FIGS. 10A to 12B may correspond to the plan view of FIG. 2.

Hereinafter, embodiments in which the second light emitting layer EL2 is formed through a deposition process using a mask (for example, a fine metal mask) will be described in detail with reference to FIGS. 10A to 12B.

Referring to FIGS. 10A to 10D, according to an embodiment, the second light emitting layer EL2 may be formed by sequentially using two masks FMM1 and FMM2.

Figure 10A:
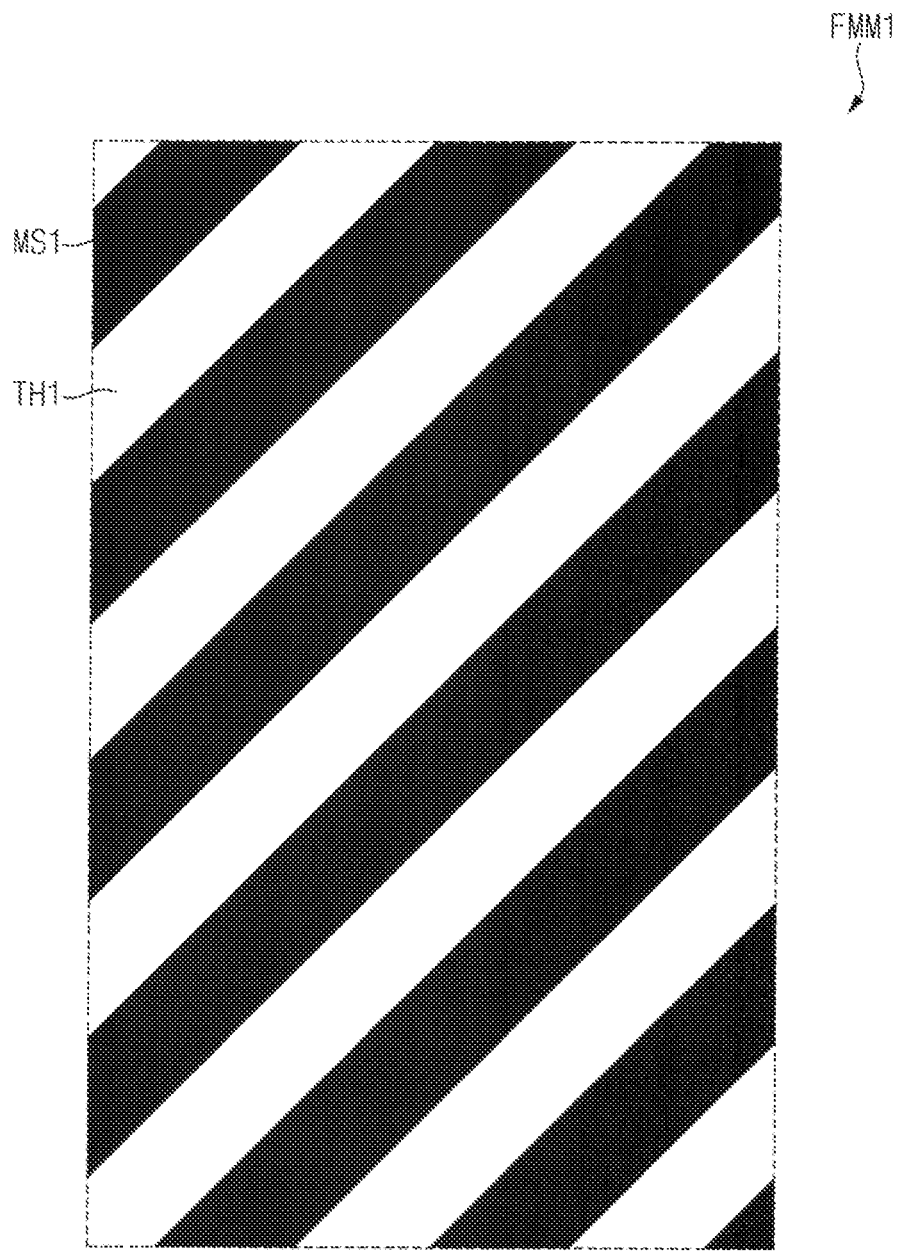
FIGS. 10A to 10D are plan views illustrating an example of a method of forming (or providing) the second light emitting layer of FIG. 8.
Figure 10B:
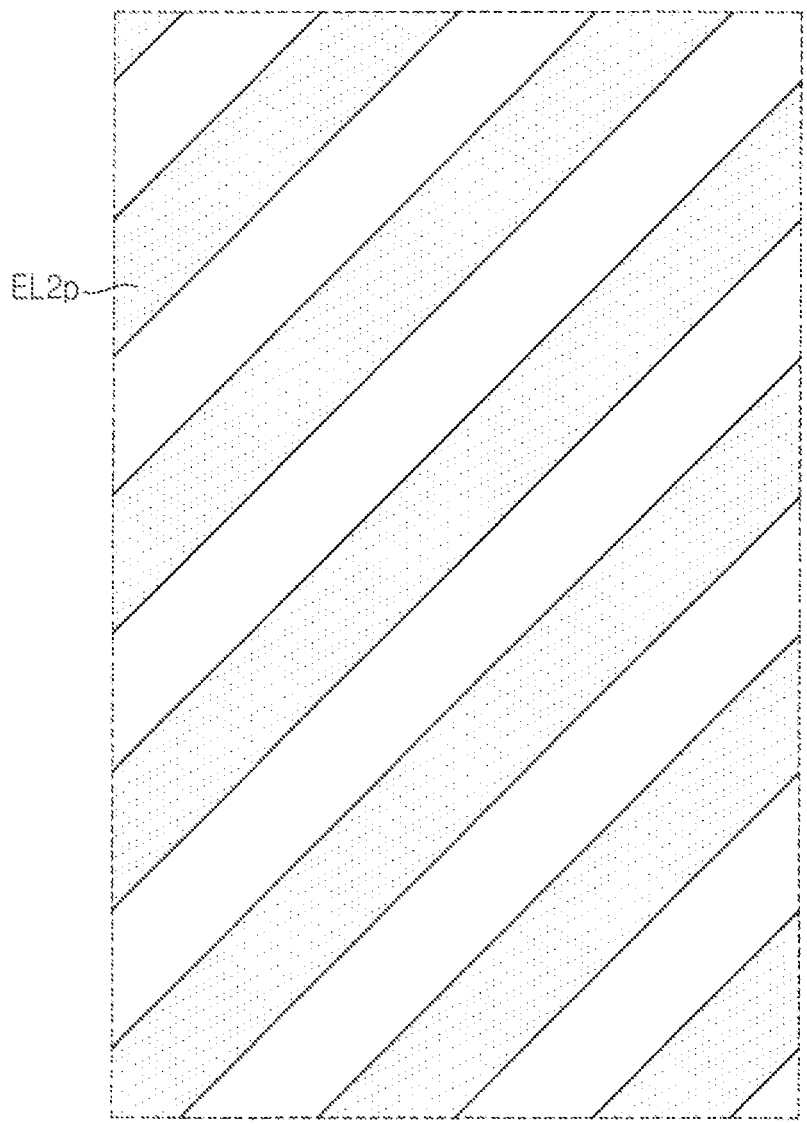

First, an organic light emitting material that emits the second light having the second wavelength range may be deposited using the mask FMM1 shown in FIG. 10A. A mask sheet MS1 of the mask FMM1 may have patterns (e.g., solid portions) which extend in a first diagonal direction, and may have (or define) a plurality of through holes TH1 arranged in a second diagonal direction intersecting the first diagonal direction. The through holes TH1 may overlap a portion of the light blocking area BA of the display panel DP to allow the organic light emitting material to pass therethrough. Accordingly, as shown in FIG. 10B, a preliminary second light emitting layer EL2p that overlaps the portion of the light blocking area BA may be formed.

Figure 10C:
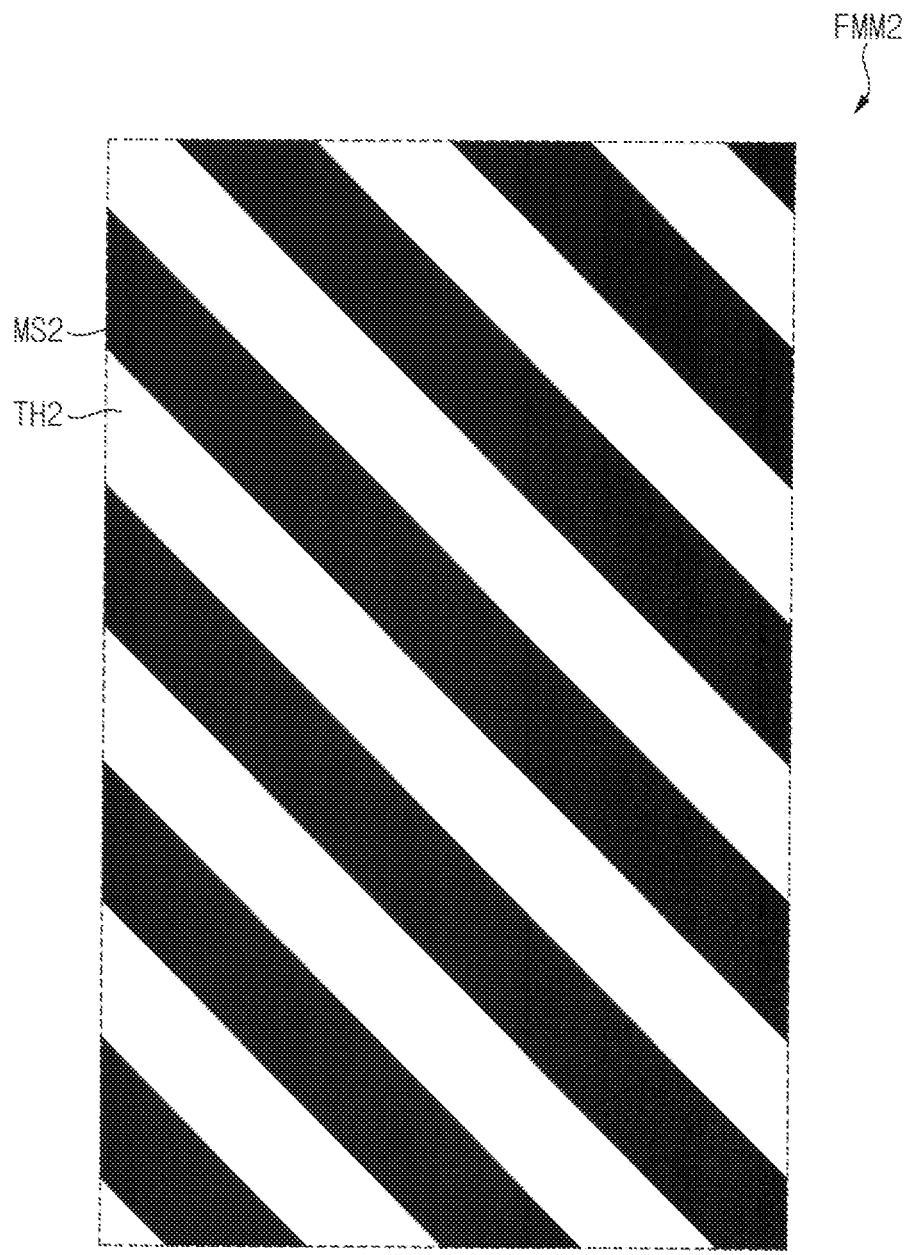
Figure 10D:
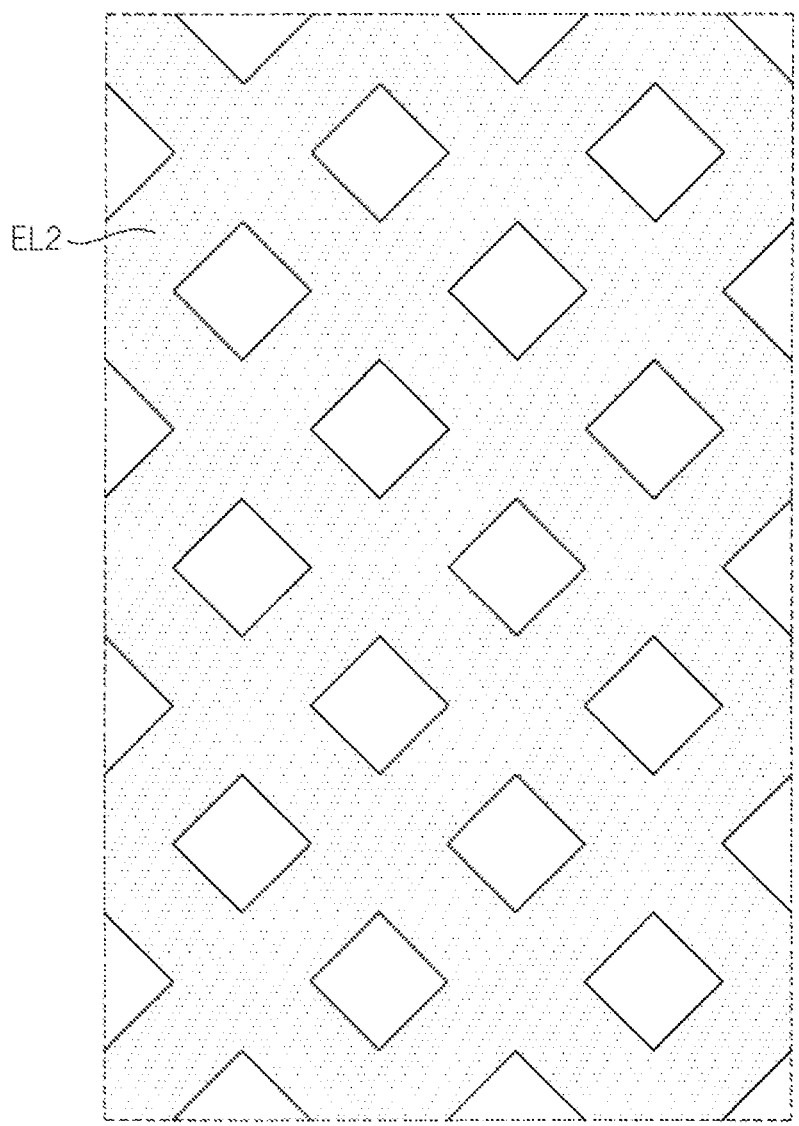

Subsequently, the organic light emitting material may be deposited once more using the mask FMM2 shown in FIG. 10C. A mask sheet MS2 of the mask FMM2 may have patterns (e.g., solid portions) which extend in the second diagonal direction and may have a plurality of through holes TH2 that are arranged along the first diagonal direction. The through holes TH2 may overlap a portion of the light blocking area BA of the display panel DP to allow the organic light emitting material to pass therethrough. Accordingly, as shown in FIG. 10D, the second light emitting layer EL2 that entirely overlaps the light blocking area BA may be formed.

Referring to FIGS. 11A and 11B, according to an embodiment, a second light emitting layer EL2' may be formed using one mask FMM3.

A mask sheet MS3 of the mask FMM3 may include island patterns (e.g., solid portions) that overlap each of the first to third pixel areas PA1, PA2, and PA3 of the display panel DP, bridges (e.g., solid portions) that connect adjacent island patterns to each other, and a plurality of through holes TH3 that are arranged along the first diagonal direction. In an embodiment, the bridges may extend in the first diagonal direction and may have a narrow width in the second diagonal direction. Accordingly, as shown in FIG. 11B, a second light emitting layer EL2' substantially overlapping the light blocking area BA may be formed. Open portions (e.g., non-solid portions) of the second light emitting layer EL2' may define separated (solid) portions each extending along the first diagonal direction.

Referring to FIGS. 12A and 12B, according to an embodiment, a second light emitting layer EL2" may be formed using one mask FMM4.

A mask sheet MS4 of the mask FMM4 may include island patterns that overlap each of the first to third pixel areas PA1, PA2, and PA3 of the display panel DP, first and second bridges that connect adjacent island patterns to each other, and a plurality of enclosed through holes TH4 that are defined by the solid portions (e.g., mask sheet MS4). In an embodiment, the first bridges may extend in the first diagonal direction and may have a narrow width in the second diagonal direction. The second bridges may extend in the second diagonal direction and may have a narrow width in the first diagonal direction. Accordingly, as shown in FIG. 12B, a second light emitting layer EL2" substantially overlapping the light blocking area BA may be formed. Open portions (e.g., non-solid portions) of the second light emitting layer EL2" may define separated (solid) portions each as a discrete pattern.

Referring back to FIG. 9, the second common electrode CE2 and the second encapsulation layer EC2 may be formed on the second light emitting layer EL2 and the second pixel defining layer PDL2.

Then, the discoloration layer PL may be formed on the second encapsulation layer EC2. In an embodiment, the discoloration layer PL may have a shape corresponding to a shape of the light blocking area BA in a plan view. That is, the discoloration layer PL may have a lattice shape surrounding each of the first to third pixel areas PA1, PA2, and PA3 in a plan view.

In an embodiment, the discoloration layer PL may be entirely formed on the second encapsulation layer EC2 by using an organic material such as a photoresist or the like and a photochromic material that is discolored by the second light L2 (for example, an ultraviolet light) having the second wavelength range. Subsequently, the discoloration layer PL may be partially removed to form the color-changeable layer opening OPP that exposes each of the first to third pixel areas PA1, PA2, and PA3.

Next, the planarization layer OC and the second light blocking layer BL2 may be formed on the discoloration layer PL, to complete the structure shown in FIG. 3.

Figure 13:
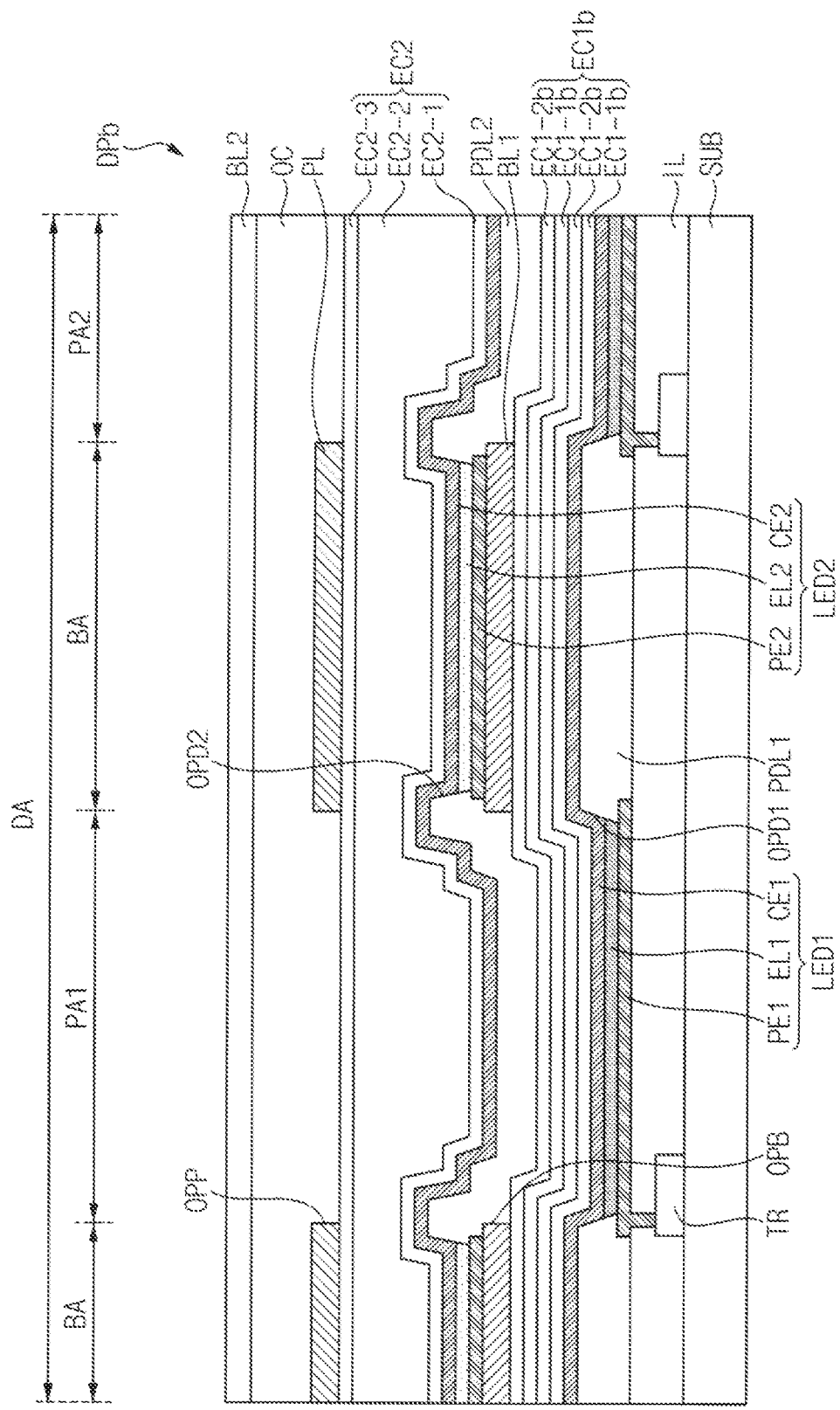
FIG. 13 is a sectional view illustrating a display panel according to an embodiment of the present disclosure.

FIG. 13 is a sectional view illustrating a display panel DPb according to an embodiment of the present disclosure. For example, FIG. 13 may correspond to the sectional view of FIG. 3. In the following description, the display panel DPb according to the present embodiment will be described while focusing on differences from the display panel DP described with reference to FIG. 3, and repeated descriptions will be omitted or simplified.

Referring to FIG. 13, according to an embodiment, the first encapsulation layer EC1b may have a distributed Bragg reflector (DBR) structure. For example, the first encapsulation layer EC1b may have a structure in which more than one first inorganic encapsulation layer EC1-1b and more than one second inorganic encapsulation layer EC1-2b which have a refractive index different from that of the first inorganic encapsulation layer EC1-1b are alternately stacked in a direction away from the substrate SUB. For example, the first encapsulation layer EC1b may not include (e.g., may exclude) an organic encapsulation layer EC1-2.

Figure 14:
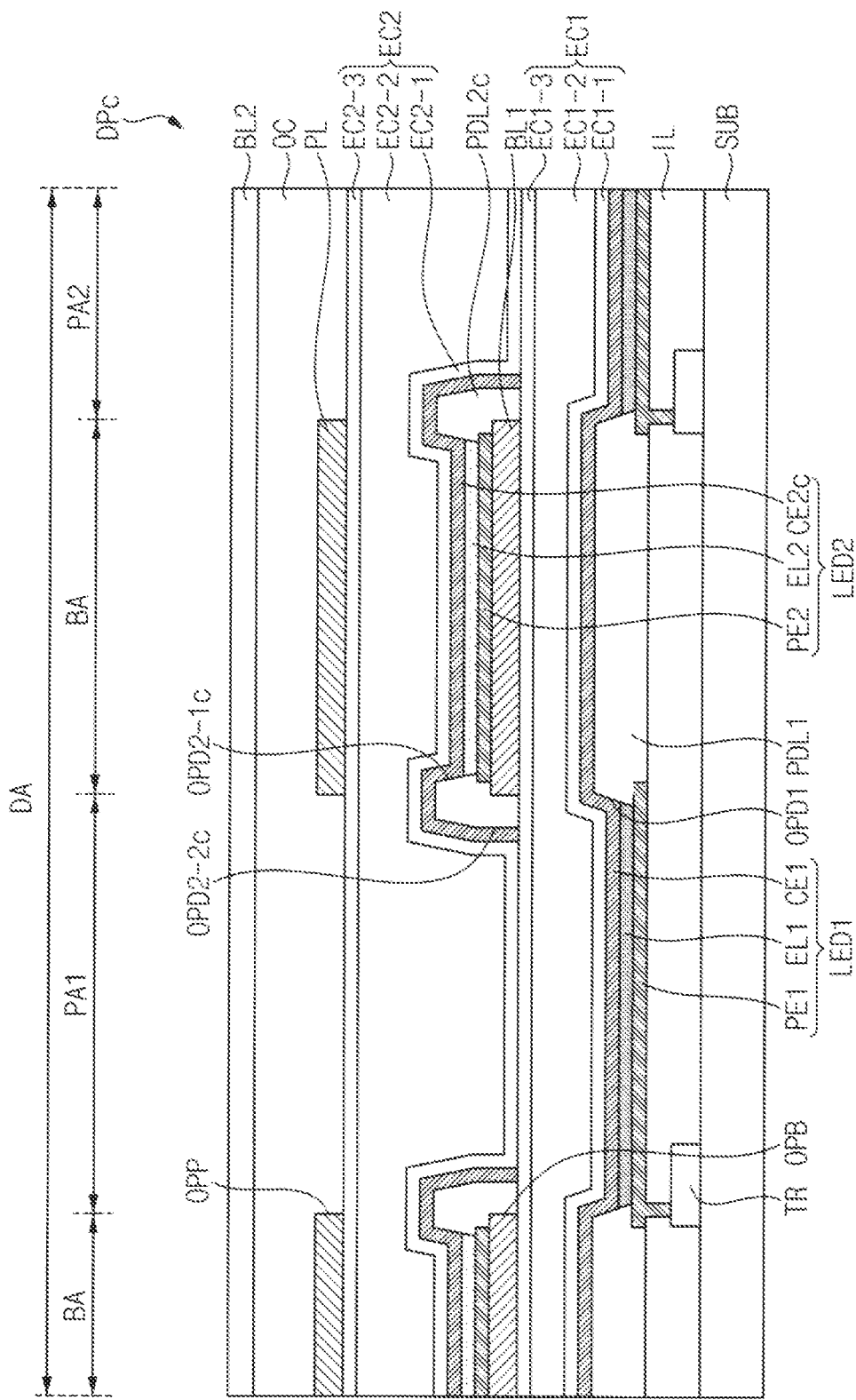
FIG. 14 is a sectional view illustrating a display panel according to an embodiment of the present disclosure.

FIG. 14 is a sectional view illustrating a display panel DPc according to an embodiment of the present disclosure. For example, FIG. 14 may correspond to the sectional view of FIG. 3. In the following description, the display panel DPc according to the present embodiment will be described while focusing on differences from the display panel DP described with reference to FIG. 3, and repeated descriptions will be omitted or simplified.

Referring to FIGS. 14, according to an embodiment, a second pixel defining layer PDL2c may have a first opening OPD2-1c and a second opening OPD2-2c. The first opening OPD2-1c may expose a portion of the second pixel electrode PE2, and the second opening OPD2-2c may expose each of the first to third pixel areas PA1, PA2, and PA3. For example, the second pixel defining layer PDL2c may be respectively disposed at a boundary between each of the first to third pixel areas PA1, PA2, and PA3, and the light blocking area BA. That is, the second pixel defining layer PDL2c may have a band shape surrounding each of the first to third pixel areas PA1, PA2, and PA3 in a plan view.

In an embodiment, the second common electrode CE2c may be provided in plural including a plurality of common electrodes patterns of a common electrode layer, which define a common electrode opening that exposes each of the first to third pixel areas PA1, PA2, and PA3 to outside of the common electrode layer. That is, the second common electrode CE2c may have a shape corresponding to a shape of the light blocking area BA in a plan view. In other words, the second common electrode CE2c may have a lattice shape surrounding each of the first to third pixel areas PA1, PA2, and PA3 in a plan view.

According to the present embodiment, the second pixel defining layer PDL2c and the second common electrode CE2c may expose at least a portion of each of the first to third pixel areas PA1, PA2, and PA3. Accordingly, the transmittance of the first light emitted from the first light emitting layer EL1 may be improved.

Figure 15:
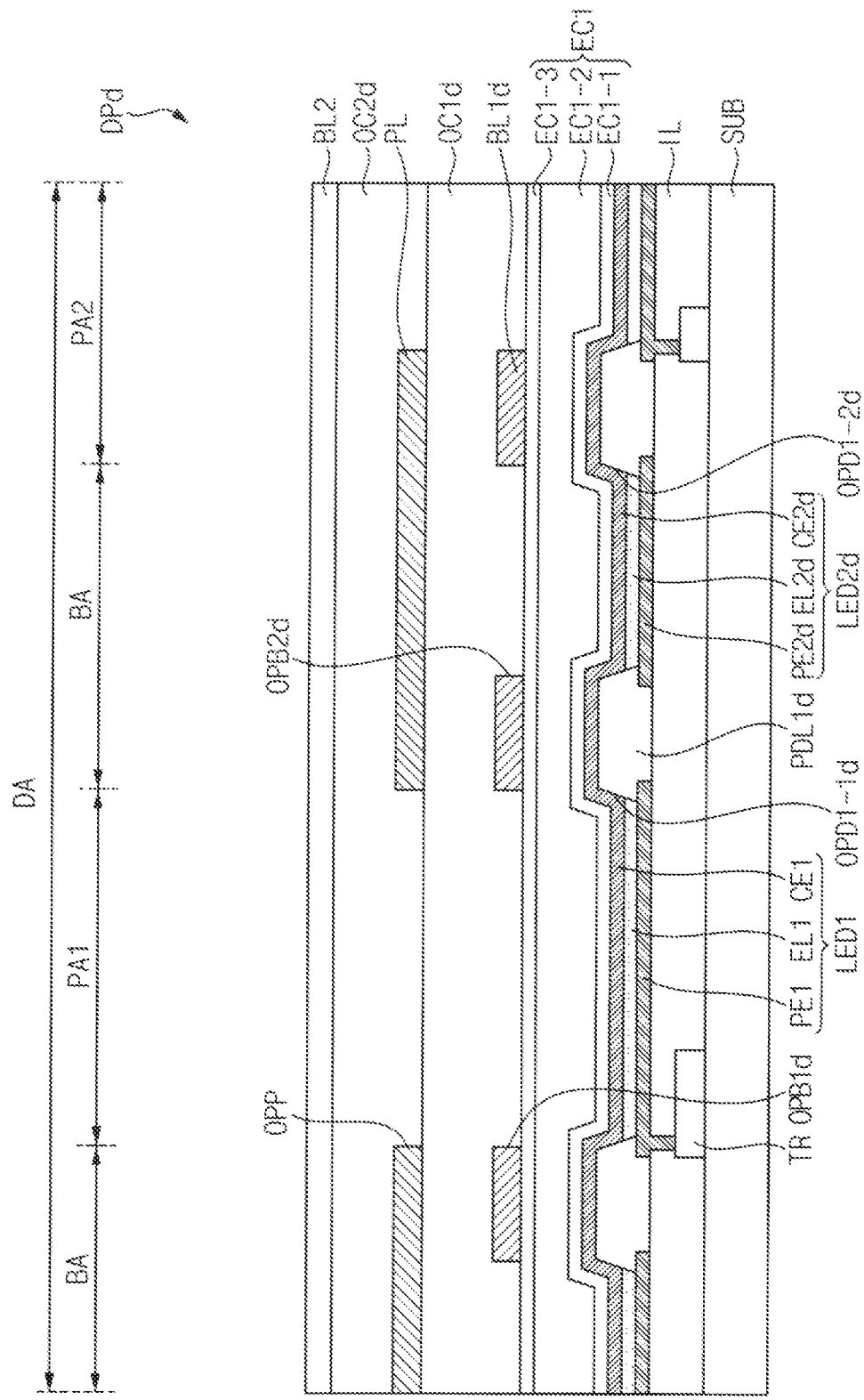
FIG. 15 is a sectional view illustrating a display panel according to an embodiment of the present disclosure.

FIG. 15 is a sectional view illustrating a display panel DPd according to an embodiment of the present disclosure. For example, FIG. 15 may correspond to the sectional view of FIG. 3. In the following description, the display panel DPd according to the present embodiment will be described while focusing on differences from the display panel DP described with reference to FIG. 3, and repeated descriptions will be omitted or simplified.

Referring to FIG. 15, according to an embodiment, a second light emitting device LED2d may be disposed on the substantially same layer as the first light emitting device LED1. As being on a same layer, elements may be formed in a same process and/or as including a same material, elements may be in a same layer as each other as respective portions of a same material layer, may be on a same layer by forming an interface with a same underlying or overlying layer, etc., without being limited thereto. That is, the second light emitting device LED2d may be disposed between the insulating structure IL and the first encapsulation layer EC1. The first light emitting device LED1 may include the first pixel electrode PE1, the first light emitting layer ELL and the first common electrode CE1, and the second light emitting device LED2d may include a second pixel electrode PE2d, a second light emitting layer EL2d, and a second common electrode CE2d.

The first pixel electrode PE1 may be disposed on the insulating structure IL. The first pixel electrode PE1 may include a conductive material. In an embodiment, the plurality of first pixel electrodes PE1 may be disposed in the form of an island pattern and may overlap the first to third pixel areas PA1, PA2, and PA3, respectively, in a plan view.

The second pixel electrode PE2d may be disposed on the insulating structure IL while being spaced apart from the first pixel electrode PE1 in a direction along the substrate SUB. The second pixel electrode PE2d may be disposed on the substantially same layer as the first pixel electrode PE1. That is, the second pixel electrode PE2d may include the same material as the first pixel electrode PE1 and may be formed substantially simultaneously with the first pixel electrode PE1.

In an embodiment, the second pixel electrode PE2d may have a shape corresponding to a shape of the light blocking area BA in a plan view. That is, the second pixel electrode PE2d may have a lattice shape surrounding each of the first to third pixel areas PA1, PA2, and PA3 in a plan view.

In an embodiment, a conductive layer may be formed on the insulating structure IL. Next, a portion of the conductive layer overlapping a boundary between each of the first to third pixel areas PA1, PA2, and PA3 and the light blocking area BA may be removed from the conductive layer so that the first pixel electrode PE1 having a shape of an island pattern in a plan view and a second pixel electrode PE2d having a lattice shape surrounding the first pixel electrode PE1 while being spaced apart from the first pixel electrode PE1 (for example, a lattice shape surrounding each of the island patterns while being spaced apart from the island patterns) may be simultaneously formed.

The first pixel defining layer PDL1d may be disposed on the first pixel electrode PE1 and the second pixel electrode PE2d. In an embodiment, the first pixel defining layer PDL1d may have a first opening OPD1-1d and a second opening OPD1-2d. The first opening OPD1-1d may expose a portion of the first pixel electrode PE1, and the second opening OPD1-2d may expose a portion of the second pixel electrode PE2d. For example, the first pixel defining layer PDL1d may be disposed at the boundary between each of the first to third pixel areas PA1, PA2, and PA3 and the light blocking area BA. That is, the first pixel defining layer PDL1d may have a band shape surrounding each of the first to third pixel areas PA1, PA2, and PA3 in a plan view.

The first light emitting layer EL1 may be disposed on the first pixel electrode PE1. The first light emitting layer EL1 may be disposed on the portion of the first pixel electrode PE1 exposed by the first opening OPD1-1d of the first pixel defining layer PDL1d. That is, the first light emitting layer EL1 may overlap each of the first to third pixel areas PA1, PA2, and PA3. The first light emitting layer EL1 may include an organic light emitting material that emits the first light (for example, L1 of FIG. 6A) having the first wavelength range.

The second light emitting layer EL2d may be disposed on the second pixel electrode PE2d. The second light emitting layer EL2d may be disposed on the portion of the second pixel electrode PE2d exposed by the second opening OPD1-2d of the first pixel defining layer PDL1d. That is, the second light emitting layer EL2d may overlap the light blocking area BA while being spaced apart from the first light emitting layers EL1. The second light emitting layer EL2d may include an organic light emitting material that emits the second light (for example, L2 of FIG. 6B) having the second wavelength range.

The first common electrode CE1 may be disposed on the first light emitting layer EL1, and the second common electrode CE2d may be disposed on the second light emitting layer EL2d. In an embodiment, the first common electrode CE1 and the second common electrode CE2d may be integrally formed.

In an embodiment, the first light emitting device LED1 may be an active matrix type, and the second light emitting device LED2d may be a passive matrix type. In an embodiment, each of the first light emitting device LED1 and the second light emitting device LED2d may be an active matrix type. In this case, a driving transistor (not shown) that controls the second light emitting device LED2d may be further disposed between the substrate SUB and the insulating structure IL.

The first encapsulation layer EC1 may cover the first light emitting device LED1 and the second light emitting device LED2d. The first encapsulation layer EC1 may entirely overlap the first to third pixel areas PA1, PA2, and PA3 and the light blocking area BA.

In an embodiment, the first encapsulation layer EC1 may have a structure in which at least one inorganic layer and at least one organic layer are stacked. For example, the first encapsulation layer EC1 may have a structure in which the first inorganic encapsulation layer EC1-1, the organic encapsulation layer EC1-2, and the second inorganic encapsulation layer EC1-3 are alternately stacked.

A first light blocking layer BL1d may be disposed on the first encapsulation layer EC1. In an embodiment, the first light blocking layer BL1d may include a first light blocking layer opening OPB1d and a second light blocking layer opening OPB2d. The first light blocking layer opening OPB1d of the first light blocking layer BL1d may correspond to the first opening OPD1-1d of the first pixel defining layer PDL1d, and the second light blocking layer opening OPB2d of the first light blocking layer BL1d may correspond to the second opening OPD1-2d of the first pixel defining layer PDL1d. That is, the first light blocking layer BL1d may expose each of the first light emitting layer EL1 and the second light emitting layer EL2d. The first light emitted from the first light emitting layer EL1 may travel in the upward direction (for example, to the color-changeable layer opening OPP of the discoloration layer PL) by passing through the first light blocking layer opening OPB1d of the first light blocking layer BL1d. The second light emitted from the second light emitting layer EL2d may travel in the upward direction (for example, toward the discoloration layer PL) by passing through the second light blocking layer opening OPB2d of the first light blocking layer BL1d.

In an embodiment, the first light blocking layer BL1d may have a shape corresponding to that of the first pixel defining layer PDL1d in a plan view. For example, the first light blocking layer BL1d may be disposed at a boundary between each of the first to third pixel areas PA1, PA2, and PA3 and the light blocking area BA. That is, the first light blocking layer BL1d may have a band shape surrounding each of the first to third pixel areas PA1, PA2, and PA3 in a plan view.

A first planarization layer OC1d that covers the first light blocking layer BL1d may be disposed on the first encapsulation layer EC1. The first planarization layer OC1d may include an organic material. The first planarization layer OC1d may provide a substantially flat top surface, and may form a predetermined gap between the first light blocking layer BL1d and the discoloration layer PL along the thickness direction.

The discoloration layer PL may be disposed on the first planarization layer OC1d. The discoloration layer PL may include a photochromic material that is discolored by the second light L2 having the second wavelength range. The discoloration layer PL may overlap the second light blocking layer opening OPB2d of the first light blocking layer BL1d. That is, the discoloration layer PL may overlap the second light emitting layer EL2d. The discoloration layer PL may be discolored by the second light that is emitted from the second light emitting layer EL2d and pass through the second light blocking layer opening OPB2d of the first light blocking layer BL1d.

In an embodiment, the discoloration layer PL may have a shape corresponding to a shape of the light blocking area BA in a plan view. That is, the discoloration layer PL may have a lattice shape surrounding each of the first to third pixel areas PA1, PA2, and PA3 in a plan view. The discoloration layer PL may have a color-changeable layer opening OPP that exposes each of the first to third pixel areas PA1, PA2, and PA3. The color-changeable layer opening OPP of the discoloration layer PL may correspond to the first opening OPD1-1d of the first pixel defining layer PDL1d and the first light blocking layer opening OPB1d of the first light blocking layer BL1d.

A second planarization layer OC2d that covers the first light blocking layer BL1d may be disposed on the first planarization layer OC1d. The second planarization layer OC2d may provide a substantially flat top surface. The second light blocking layer BL2 may be disposed on the second planarization layer OC2d.

Figure 16:
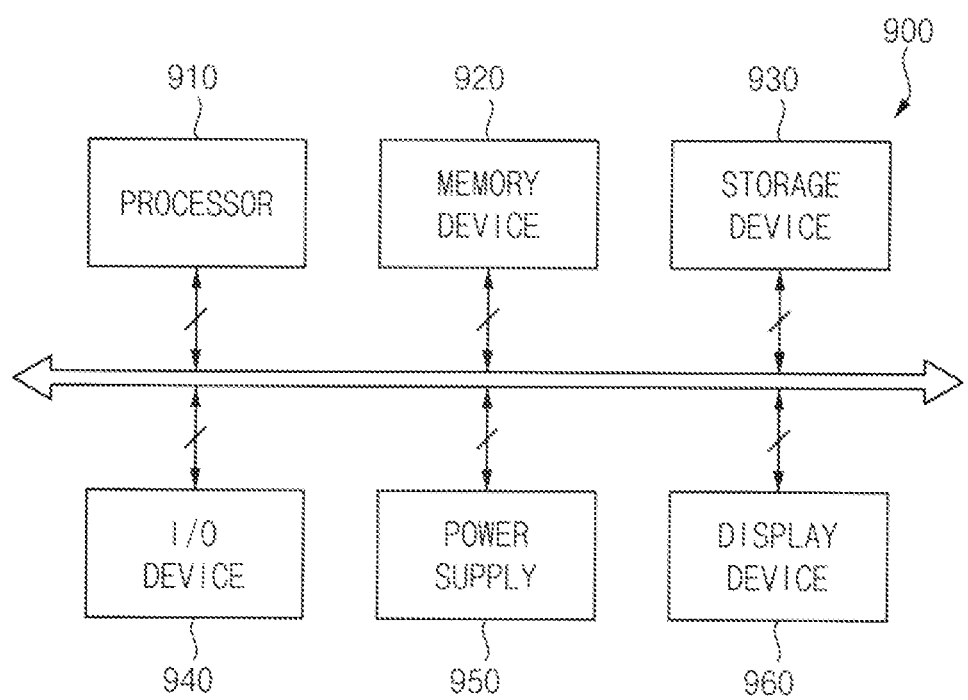
FIG. 16 is a block diagram illustrating an electronic device according to an embodiment of the present disclosure.

FIG. 16 is a block diagram illustrating an electronic device 900 according to an embodiment of the present disclosure.

Referring to FIG. 16, according to an embodiment, an electronic device 900 may include a processor 910, a memory device 920, a storage device 930, an input/output (I/O) device 940, a power supply 950, and a display device 960. In this case, the display device 960 may correspond to any one of the display panel DP of FIG. 3, the display panel DPb of FIG. 13, the display panel DPc of FIG. 14, and the display panel DPd of FIG. 15. The electronic device 900 may further include various ports capable of communicating with a video card, a sound card, a memory card, a USB device, or the like.

The processor 910 may perform specific calculations or tasks. In an embodiment, the processor 910 may be a microprocessor, a central processing unit (CPU), an application processor (AP), or the like. The processor 910 may be connected to other components through an address bus, a control bus, a data bus, or the like. In an embodiment, the processor 910 may also be coupled to an expansion bus, such as a peripheral component interconnect (PCI) bus.

The memory device 920 may store data required for the operation of the electronic device 900. For example, the memory device 920 may include non-volatile memory devices such as an erasable programmable read-only memory (EPROM) device, an electrically erasable programmable read-only memory (EEPROM) device, a flash memory device, a PRAM (PRAM) device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, or the like and/or volatile memory devices such as a dynamic random access memory (DRAM) device, a static random access memory (SRAM) device, a mobile DRAM device, or the like.

The storage device 930 may include a solid state drive (SSD), a hard disk drive (HDD), a CD-ROM, or the like. The input/output device 940 may include input devices such as a keyboard, a keypad, a touch pad, a touch screen, a mouse, or the like and output devices such as a speaker and a printer.

The power supply 950 may supply power required for the operation of the electronic device 900. The display device 960 may be connected to other components through buses or other communication links. According to an embodiment, the display device 960 may be included in the input/output device 940.

Figure 17:
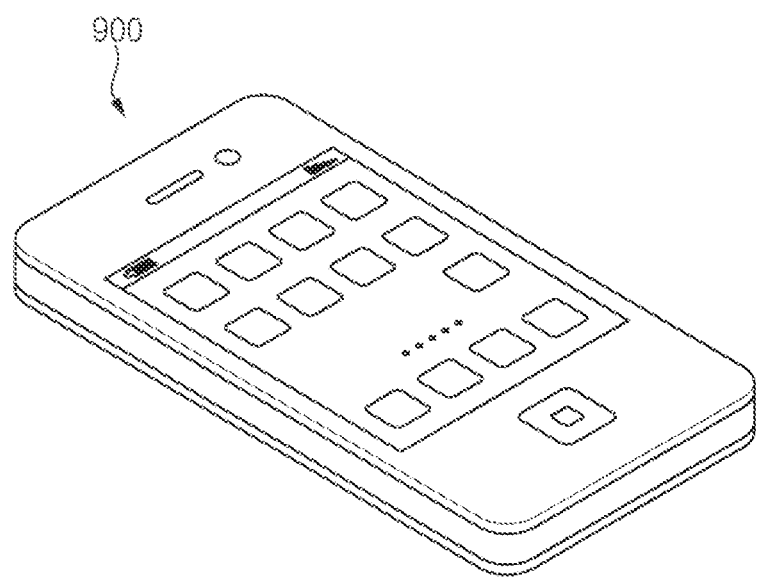
FIG. 17 is a view illustrating an example in which the electronic device of FIG. 16 is implemented as a smartphone.
Figure 18:
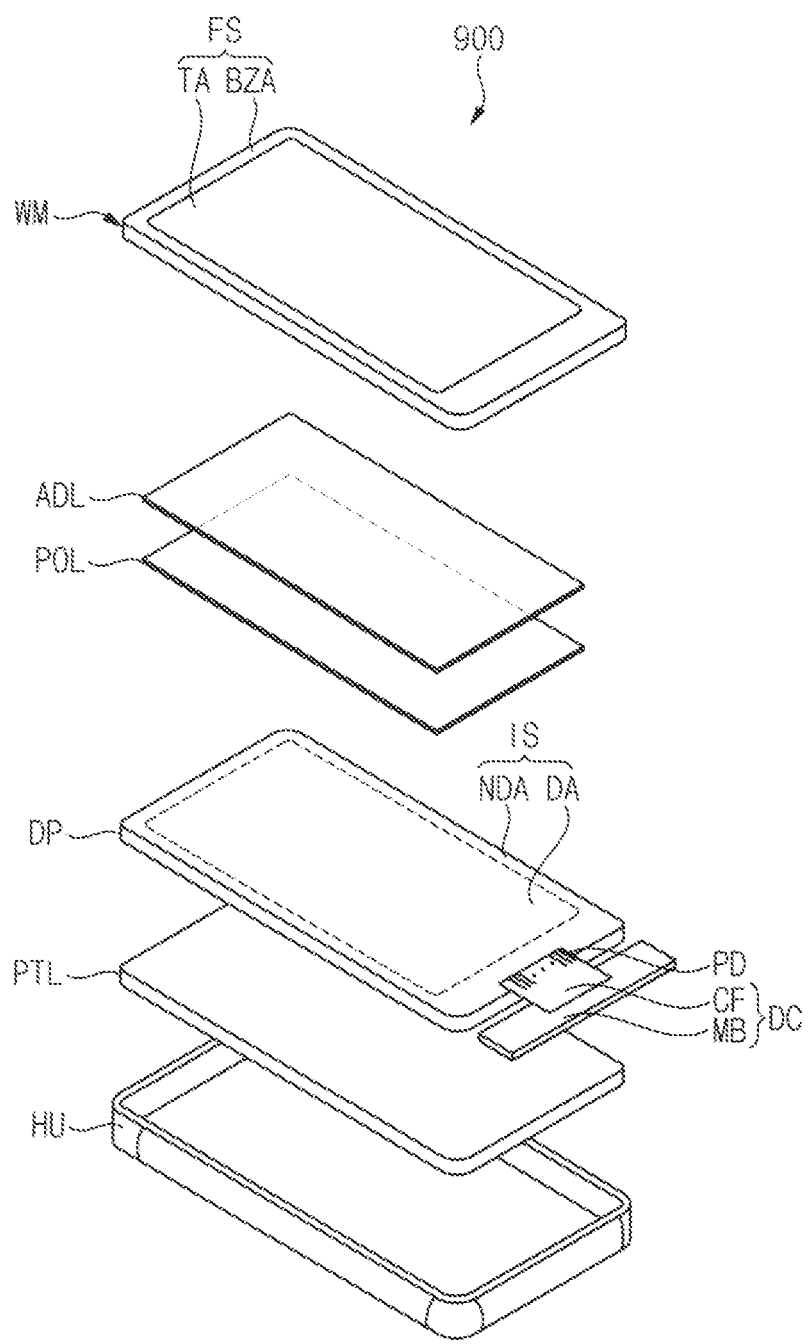
FIG. 18 is an exploded perspective view of the electronic device of FIG. 17.

FIG. 17 is a view illustrating an example in which the electronic device 900 of FIG. 16 is implemented as a smartphone. FIG. 18 is an exploded perspective view of the electronic device 900 of FIG. 17.

Referring to FIG. 17, according to an embodiment, the electronic device 900 may be implemented as a smartphone. However, the electronic device 900 may not be limited thereto, and for example, the electronic device 900 may be implemented as a television, a mobile phone, a video phone, a smart pad, a smart watch, a tablet PC, a vehicle navigation, a computer monitor, a notebook computer, a head mounted display (HMD), a kiosk, or the like. Hereinafter, an embodiment in which the electronic device 900 is implemented as a smartphone will be described in more detail with reference to FIGS. 17 and 18.

Referring to FIGS. 17 and 18, according to an embodiment, the electronic device 900 may include a window WM, a set module, and a housing HU. The set module may include a display panel DP, an optical film POL, an adhesive layer ADL, a circuit board DC, and a protective layer PTL. The window WM and the housing HU may be combined to define the external appearance of the electronic device 900.

The display panel DP may display an image. The display panel DP may be driven in the first mode for implementing a wide viewing angle or the second mode for implementing a narrow viewing angle. The display panel DP may correspond to any one of the display panel DP of FIG. 3, the display panel DPb of FIG. 13, the display panel DPc of FIG. 14, and the display panel DP d of FIG. 15.

The circuit board DC may be connected to the display panel DP. The circuit board DC may include a flexible circuit board CF and a main circuit board MB. The flexible circuit board CF may include an insulating film and conductive wires which are mounted on the insulating film. The conductive wires may be connected to the pads PD to electrically connect the circuit board DC and the display panel DP. For example, the flexible circuit board CF may be bent in a downward direction of the display panel DP. Accordingly, the main circuit board MB may be disposed under the display panel DP (for example, under the protective layer PTL) so that the main circuit board MB may be accommodated in a space provided by the housing HU.

The main circuit board MB may include signal lines and electronic elements. For example, the main circuit board MB may include the first driving unit and the second driving unit described above. The first driving unit may generate the driving signal for controlling the operation of the first light emitting device LED1 and provide the driving signal to the display panel DP. The second driving unit may generate the driving signal for controlling the operation of the second light emitting device LED2 and provide the driving signal to the display panel DP.

The window WM may be disposed on the display panel DP to cover a front surface IS of the display panel DP. The window WM may have light-transmitting properties. For example, the window WM may include a resin film such as polyimide or ultra-thin glass.

The window WM may include a front surface FS exposed to the outside of the electronic device 900. The front (display) surface of the electronic device 900 may be substantially defined by the front surface FS of the window WM. The front surface FS of the window WM may include a transmission area TA corresponding to the display area DA and a bezel area BZA which corresponds to the non-display area NDA.

In an embodiment, the window WM may selectively block the second light L2 having the second wavelength range. That is, the window WM may transmit the first light L1 having the first wavelength range. In this case, the window WM may prevent the second light L2, which is emitted from the second light emitting device LED2 of the display panel DP, from being emitted to the outside of the electronic device 900. For example, the window WM may have a structure in which a blocking material such as metal oxide particles or benzoxazine particles is dispersed in a resin film. In the present embodiment, the second light blocking layer BL2 of the display panel DP may be omitted.

The optical film POL may be disposed between the window WM and the display panel DP. The optical film POL may prevent or reduce reflection of an external light incident through the window WM. In an embodiment, the optical film POL may include a polarizing film or a color filter.

The adhesive layer ADL may be disposed between the optical film POL and the window WM. The adhesive layer ADL may have light-transmitting properties.

The protective layer PTL may be disposed under the display panel DP. The protective layer PTL may include various layers for protecting the display panel DP from external impact. For example, the protective layer PTL may include a cushion layer having a foam shape, a light blocking layer, a heat dissipation layer, a support layer, or the like.

The present disclosure can be applied to various display devices. For example, the present disclosure is applicable to various display devices such as display devices for vehicles, ships and aircrafts, portable communication devices, display devices for exhibition or information transmission, medical display devices, or the like.

Although it has been described with reference to embodiments of the present disclosure, it will be understood to those skilled in the art that various modifications and variations are possible without departing from the idea and scope of the present disclosure described in the claims.

What is claimed is:

1. A display panel comprising:
   a display area including a pixel area, and a light blocking area which is adjacent to the pixel area;
   a first light emitting element which is in the pixel area of the display area and emits a light having a first wavelength range;
   a second light emitting element which is in the light blocking area of the display area and emits a light having a second wavelength range different from the first wavelength range; and
   a discoloration layer which is on the second light emitting element and is color-changeable by the light having the second wavelength range, the discoloration layer defining a first opening exposing the pixel area to outside the discoloration layer.

2. The display panel of claim 1, wherein
   the light blocking area of the display area, and the discoloration layer, each has a planar shape, and
   the planar shape of the discoloration layer corresponds to the planar shape of the light blocking area.

3. The display panel of claim 1, further comprising a first encapsulation layer which covers the first light emitting element and is between the first light emitting element and the second light emitting element.

4. The display panel of claim 3, wherein within the display area:
   the first light emitting element which is in the pixel area, is an active matrix type, and
   the second light emitting element which is in the light blocking area, is a passive matrix type.

5. The display panel of claim 3, wherein within the display area:
   the first light emitting element includes a first pixel electrode, a first light emitting layer and a first common electrode,
   the second light emitting element includes a second pixel electrode, a second light emitting layer and a second common electrode,
   the light blocking area of the display area, and the second light emitting layer, each has a planar shape, and
   the planar shape of the second light emitting layer corresponds to the planar shape of the light blocking area.

6. The display panel of claim 5, wherein
   the second pixel electrode has a planar shape, and
   the planar shape of the second pixel electrode corresponds to the planar shape of the light blocking area.

7. The display panel of claim 5, wherein the second common electrode overlaps an entirety of the pixel area and the light blocking area.

8. The display panel of claim 5, wherein
the second common electrode has a planar shape, and
the planar shape of the second common electrode corresponds to the planar shape of the light blocking area.

9. The display panel of claim 5, further comprising in order along a thickness direction of the display panel:
the first pixel electrode;
a first pixel defining layer defining an opening exposing the first pixel electrode to outside the first pixel defining layer;
the first encapsulation layer;
the second pixel electrode; and
a second pixel defining layer defining an opening exposing the second pixel electrode to outside the second pixel defining layer.

10. The display panel of claim 9, wherein the second pixel defining layer overlaps the pixel area of the display area, and has a light-transmitting property.

11. The display panel of claim 9, wherein the second pixel defining layer further defines an opening corresponding to the first opening defined by the discoloration layer.

12. The display panel of claim 3, wherein the first encapsulation layer includes an inorganic encapsulation layer and an organic encapsulation layer.

13. The display panel of claim 3, wherein the first encapsulation layer includes a first inorganic encapsulation layer having a refractive index, and a second inorganic encapsulation layer having a refractive index different from the refractive index of the first inorganic encapsulation layer.

14. The display panel of claim 3, further comprising:
a first light blocking layer between the first encapsulation layer and the second light emitting element, the first light blocking layer defining a second opening corresponding to the first opening defined by the discoloration layer.

15. The display panel of claim 14, wherein
each of the first opening defined by the discoloration layer and the second opening defined by the first light blocking layer has a width, and
the width of the first opening is equal to the width of the second opening.

16. The display panel of claim 14, wherein
each of the first opening defined by the discoloration layer and the second opening defined by the first light blocking layer has a width, and
the width of the first opening is smaller than the width of the second opening.

17. The display panel of claim 3, further comprising:
a second encapsulation layer which covers the second light emitting element and is between the second light emitting element and the discoloration layer.

18. The display panel of claim 1, wherein within the display area, the second light emitting element which is in the light blocking area, is in a same layer as the first light emitting element which is in the pixel area.

19. The display panel of claim 18, wherein within the display area,
the first light emitting element which is in the pixel area is an active matrix type, and
the second light emitting element which is in the light blocking area is a passive matrix type.

20. The display panel of claim 18, wherein within the display area, each of the first light emitting element which is in the pixel area and the second light emitting element which is in the light blocking area, is an active matrix type.

21. The display panel of claim 18, wherein within the display area:
the first light emitting element includes a first pixel electrode, a first light emitting layer corresponds to the pixel area, and a first common electrode, and
the second light emitting element includes a second pixel electrode, a second light emitting layer which corresponds to the light blocking area and is spaced apart from the first light emitting layer, and a second common electrode.

22. The display panel of claim 21, further comprising in order along a thickness direction of the display panel:
the first light emitting element and the second light emitting element which are in the same layer as each other;
a first encapsulation layer which covers the first light emitting element and the second light emitting element;
a first light blocking layer which exposes each of the first light emitting layer and the second light emitting layer to outside the first light blocking layer;
a planarization layer which covers the first light blocking layer; and
the discoloration layer which overlaps the second light emitting layer defines the first opening corresponding to the first light emitting layer.

23. The display panel of claim 1, further comprising:
a second light blocking layer which is further from the first light emitting element and the second light emitting element, than the discoloration layer, transmits the light having the first wavelength range and blocks the light having the second wavelength range.

24. The display panel of claim 1, wherein the discoloration layer which is color-unchanged one of transmits and blocks at the light blocking area of the display area, and the discoloration layer which is color-changed blocks and transmits light at the light blocking area of the display area, respectively.

25. A display panel comprising:
a display area including a pixel area, and a light blocking area which is adjacent to the pixel area;
a first light emitting element which is in the pixel area of the display area and emits a light having a first wavelength range, the first light emitting element including a first pixel electrode, a first common electrode facing the first pixel electrode, and a first light emitting layer between the first pixel electrode and the first common electrode;
a second light emitting element which is in the light blocking area of the display area and emits a light having a second wavelength range different from the first wavelength range, the second light emitting element including a second pixel electrode, a second common electrode facing the second pixel electrode, and a second light emitting layer between the second pixel electrode and the second common electrode; and
a discoloration layer which is on the second light emitting element and is color-changeable by the light having the second wavelength range, the discoloration layer defining an opening exposing the pixel area to outside the discoloration layer.

26. An electronic device comprising:
a display panel which displays an image at a front surface of the display panel;
a circuit board which is connected to the display panel and controls an operation of the display panel;

a window which covers the front surface of the display panel; and a housing in which the display panel is accommodated, wherein the display panel includes:
- a display area including a pixel area, and a light blocking area which is adjacent to the pixel area;
- a first light emitting element which is in the pixel area of the display area and emits a light having a first wavelength range;
- a second light emitting element which is in the light blocking area of the display area and emits a light having a second wavelength range different from the first wavelength range; and
- a discoloration layer which is on the second light emitting element and is color-changeable by the light having the second wavelength range, the discoloration layer defining an opening exposing the pixel area to outside the discoloration layer.

27. The electronic device of claim 26, wherein the circuit board includes:
- a first driving unit which controls an operation of the first light emitting element, and
- a second driving unit which controls an operation of the second light emitting element.

28. The electronic device of claim 26, wherein the window transmits the light having the first wavelength range and blocks the light having the second wavelength range.

* * * * *